US012563998B2

(12) United States Patent
Su et al.

(10) Patent No.: US 12,563,998 B2
(45) Date of Patent: Feb. 24, 2026

(54) APPARATUS AND METHODS FOR COOLING REACTION CHAMBERS IN SEMICONDUCTOR PROCESSING SYSTEMS

(71) Applicant: ASM IP Holding B.V., Almere (NL)

(72) Inventors: Junwei Su, Tempe, AZ (US); Rutvij Naik, Tempe, AZ (US); Xing Lin, Chandler, AZ (US); Alexandros Demos, Scottsdale, AZ (US); Hamed Esmaeilzadehkhosravieh, Phoenix, AZ (US)

(73) Assignee: ASM IP Holding B.V., Almere (NL)

( * ) Notice: Subject to any disclaimer, the term of this patent is extended or adjusted under 35 U.S.C. 154(b) by 763 days.

(21) Appl. No.: 17/848,933

(22) Filed: Jun. 24, 2022

(65) Prior Publication Data

US 2022/0415677 A1 Dec. 29, 2022

Related U.S. Application Data

(60) Provisional application No. 63/216,345, filed on Jun. 29, 2021.

(51) Int. Cl.
| | |
|---|---|
| *H01L 21/67* | (2006.01) |
| *C23C 16/48* | (2006.01) |
| *G02B 5/02* | (2006.01) |
| *H10P 72/00* | (2026.01) |

(52) U.S. Cl.
CPC ........ *H10P 72/0436* (2026.01); *C23C 16/481* (2013.01); *G02B 5/0221* (2013.01); *G02B 5/0284* (2013.01)

(58) Field of Classification Search
CPC ................. C23C 16/4411; C23C 16/52; H01L 21/67109; C30B 25/16
See application file for complete search history.

(56) References Cited

U.S. PATENT DOCUMENTS

| | | | |
|---|---|---|---|
| 4,975,561 A | 12/1990 | Robinson |
| 6,021,152 A | 2/2000 | Olsen |
| 6,319,556 B1 | 11/2001 | Olsen |
| 6,455,814 B1 | 9/2002 | Samoilov |

(Continued)

FOREIGN PATENT DOCUMENTS

| | | |
|---|---|---|
| CN | 1811493 A | 8/2006 |
| CN | 111354655 A | 6/2020 |

*Primary Examiner* — Jesse S Bogue
(74) *Attorney, Agent, or Firm* — Snell & Wilmer L.L.P.

(57) ABSTRACT

A reflector includes a reflector body arranged to overlap a reaction chamber of a semiconductor processing system. The reflector body has a grooved surface and a reflective surface extending between a first longitudinal edge of the reflector body and a second longitudinal edge of the reflector body, the reflective surface spaced apart from the grooved surface by a thickness of the reflector body. The grooved surface and the reflective surface define a pyrometer port, two or more elongated slots, and two or more shortened extending through the thickness of the reflector body. The shortened slots outnumber the elongated slots to bias issue of a coolant against the reaction chamber toward the second longitudinal edge of the reflector body. Cooling kits, semiconductor processing systems, and methods of cooling a reaction chamber during deposition of a film onto a substrate supported within the reaction chamber are also described.

19 Claims, 16 Drawing Sheets

(56)                 References Cited

U.S. PATENT DOCUMENTS

| | | | | |
|---|---|---|---|---|
| 6,554,905 | B1 | 4/2003 | Goodwin | |
| 6,781,291 | B2 | 8/2004 | Halpin | |
| 6,837,589 | B2 * | 1/2005 | Nam | H01L 21/67115 |
| | | | | 315/111.21 |
| 7,173,216 | B2 | 2/2007 | Ptak | |
| 7,725,012 | B2 | 5/2010 | Aggarwal | |
| 11,680,338 | B2 * | 6/2023 | Burrows | G02B 7/008 |
| | | | | 118/728 |
| 2009/0214193 | A1 * | 8/2009 | Suzuki | H01L 21/67115 |
| | | | | 392/411 |
| 2010/0054719 | A1 * | 3/2010 | Mizukawa | H01K 1/40 |
| | | | | 313/578 |
| 2010/0116206 | A1 | 5/2010 | Sangam | |
| 2010/0116207 | A1 | 5/2010 | Givens | |
| 2011/0318909 | A1 * | 12/2011 | Gum | C23C 16/46 |
| | | | | 118/724 |
| 2014/0295106 | A1 * | 10/2014 | Sivaramakrishnan | |
| | | | | C23C 16/0209 |
| | | | | 118/724 |
| 2018/0363139 | A1 | 12/2018 | Rajavelu | |
| 2019/0368041 | A1 | 12/2019 | Sreeram | |
| 2021/0189593 | A1 | 6/2021 | Burrows et al. | |

* cited by examiner

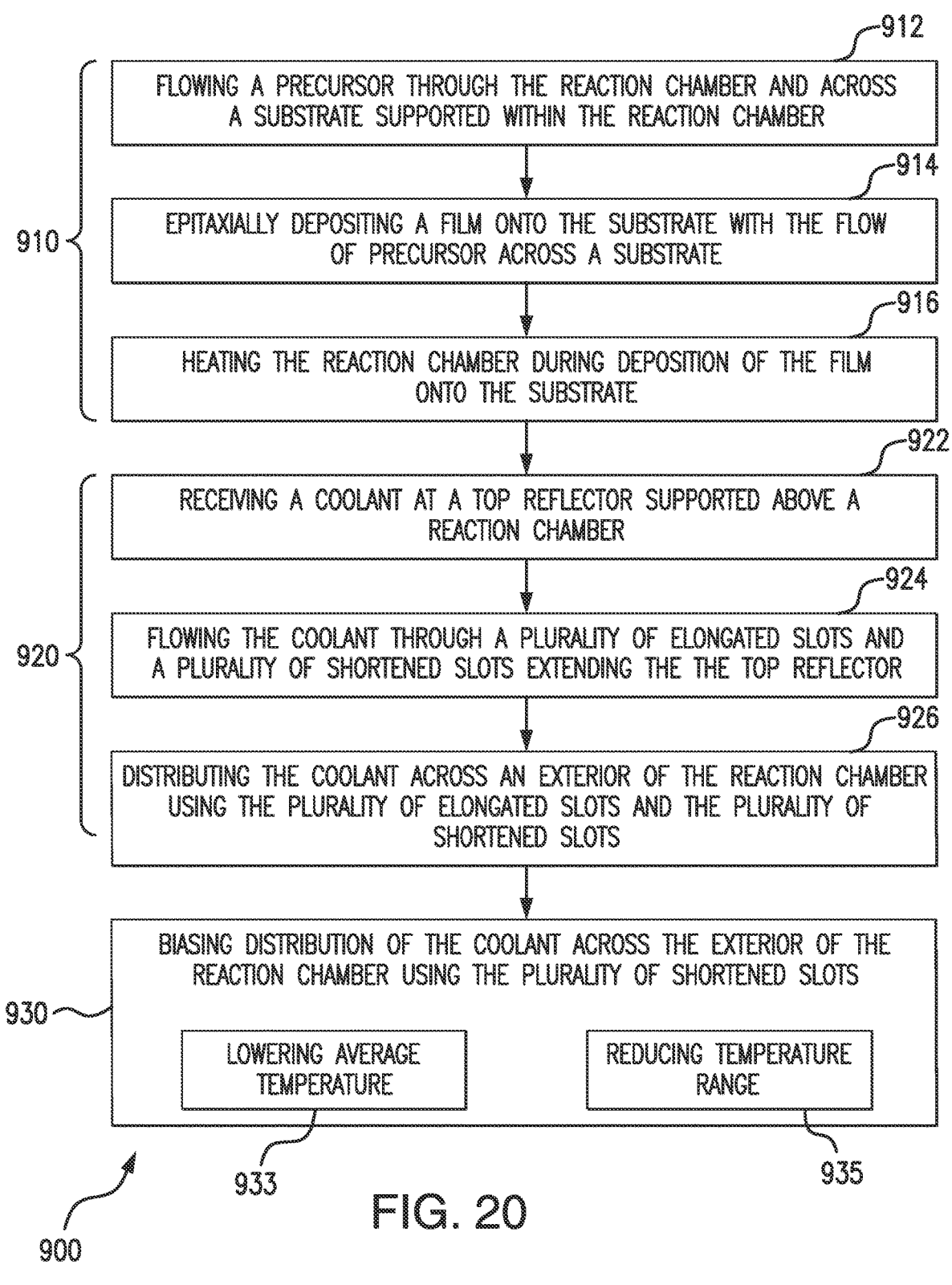

912

FLOWING A PRECURSOR THROUGH THE REACTION CHAMBER AND ACROSS A SUBSTRATE SUPPORTED WITHIN THE REACTION CHAMBER

914

EPITAXIALLY DEPOSITING A FILM ONTO THE SUBSTRATE WITH THE FLOW OF PRECURSOR ACROSS A SUBSTRATE

916

HEATING THE REACTION CHAMBER DURING DEPOSITION OF THE FILM ONTO THE SUBSTRATE

910

922

RECEIVING A COOLANT AT A TOP REFLECTOR SUPPORTED ABOVE A REACTION CHAMBER

924

FLOWING THE COOLANT THROUGH A PLURALITY OF ELONGATED SLOTS AND A PLURALITY OF SHORTENED SLOTS EXTENDING THE THE TOP REFLECTOR

926

DISTRIBUTING THE COOLANT ACROSS AN EXTERIOR OF THE REACTION CHAMBER USING THE PLURALITY OF ELONGATED SLOTS AND THE PLURALITY OF SHORTENED SLOTS

920

BIASING DISTRIBUTION OF THE COOLANT ACROSS THE EXTERIOR OF THE REACTION CHAMBER USING THE PLURALITY OF SHORTENED SLOTS

930

LOWERING AVERAGE TEMPERATURE

REDUCING TEMPERATURE RANGE

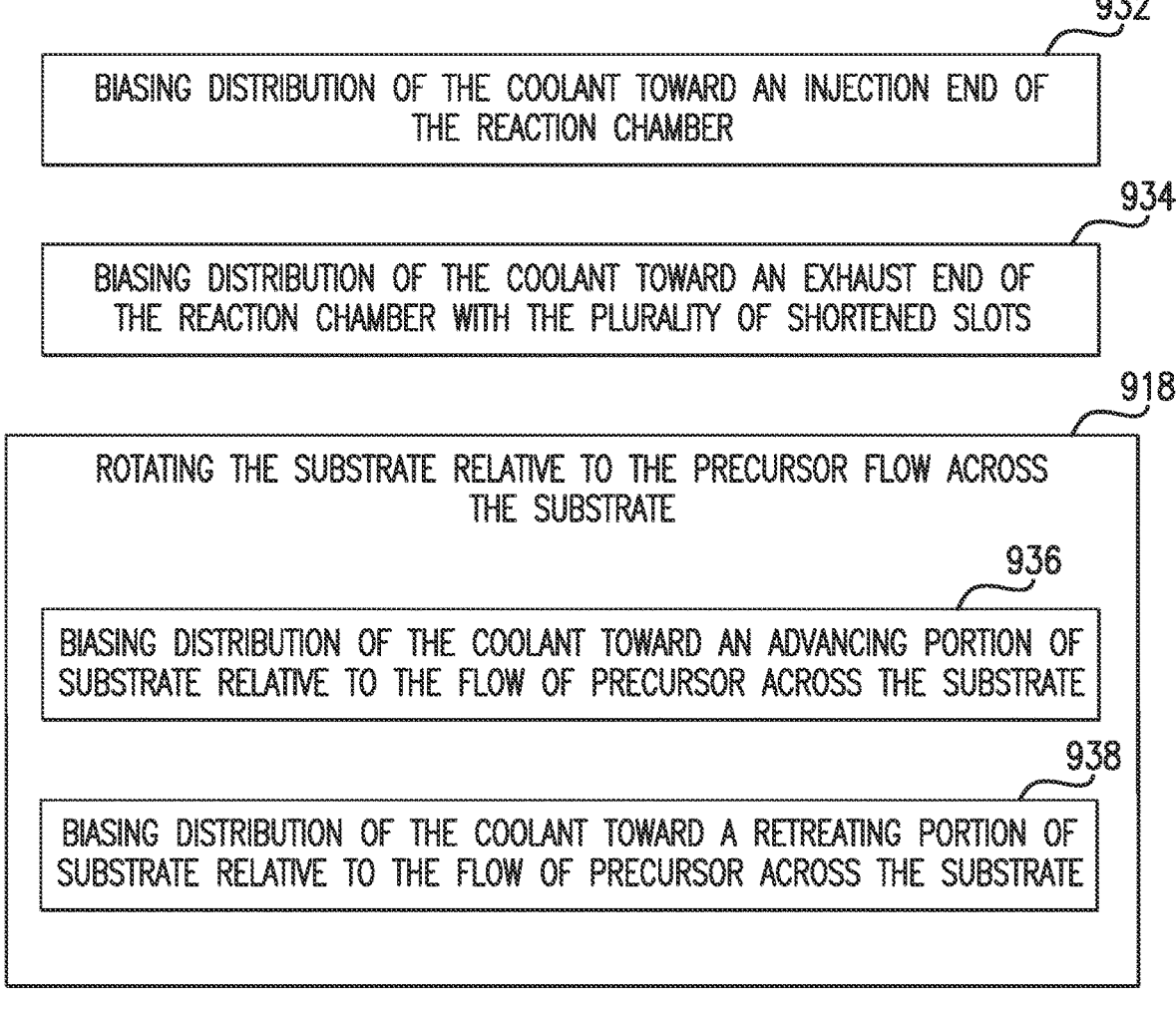

BIASING DISTRIBUTION OF THE COOLANT TOWARD AN INJECTION END OF THE REACTION CHAMBER
932

BIASING DISTRIBUTION OF THE COOLANT TOWARD AN EXHAUST END OF THE REACTION CHAMBER WITH THE PLURALITY OF SHORTENED SLOTS
934

ROTATING THE SUBSTRATE RELATIVE TO THE PRECURSOR FLOW ACROSS THE SUBSTRATE
918

BIASING DISTRIBUTION OF THE COOLANT TOWARD AN ADVANCING PORTION OF SUBSTRATE RELATIVE TO THE FLOW OF PRECURSOR ACROSS THE SUBSTRATE
936

BIASING DISTRIBUTION OF THE COOLANT TOWARD A RETREATING PORTION OF SUBSTRATE RELATIVE TO THE FLOW OF PRECURSOR ACROSS THE SUBSTRATE
938

BIASING DISTRIBUTION OF THE COOLANT ACCORDING TO HEATING OF AN INTERIOR SURFACE OF A TOP WALL OF THE REACTION CHAMBER
931

FIG. 21

APPARATUS AND METHODS FOR COOLING REACTION CHAMBERS IN SEMICONDUCTOR PROCESSING SYSTEMS

CROSS-REFERENCE TO RELATED APPLICATIONS

This application is a non-provisional of, and claims priority to and the benefit of, U.S. Provisional Patent Application No. 63/216,345, filed Jun. 29, 2021 and entitled "APPARATUS AND METHODS FOR COOLING REACTION CHAMBERS IN SEMICONDUCTOR PROCESSING SYSTEMS," which is hereby incorporated by reference herein.

FIELD OF INVENTION

The present disclosure generally relates to depositing films onto substrates. More particularly, the present disclosure relates to controlling wall temperatures within reaction chambers during the deposition of films onto substrates while supported in reaction chambers.

BACKGROUND OF THE DISCLOSURE

Films are commonly deposited onto substrates to fabricate semiconductor devices, such as power electronics and very large-scale integration circuits. Film deposition is generally accomplished by loading a substrate within a reactor and heating the substrate to a desired deposition temperature, typically using a heater thermally coupled to the reactor. Once the substrate is suitably heated, a precursor is flowed through the reactor and across the substrate. As the precursor flows across the substrate the film deposits onto the substrate, generally at a rate corresponding to temperature of the substrate. Coolant may be provided to the exterior of the reactor during film deposition to maintain the reactor wall temperature below that necessary to deposit the precursor onto the reactor walls. Typically, the coolant slows the rate at which precursor deposits on interior surface of the reactor walls, limiting the tendency of such depositions to interfere with reactor operation due to reduction in transmissivity of the reactor walls.

In some deposition operations, film may deposit onto interior surfaces of the reactor walls notwithstanding the exterior cooling of the reactor. For example, the flow pattern within some reactors may include regions of relatively slow flow and regions relative fast within the reactor, such as opposite advancing and retreating edges of a rotating substrate relative to precursor flow, potentially causing variation in temperature on the interior surface of the reactor wall. The localized increased temperature at such locations may, over time, cause film to deposit on the interior surface of the reactor wall bounding the slowing or eddy flow region. Once formed, such the film may limit transmissivity of the reactor wall, further increasing reactor wall temperature, and accelerating film deposition onto the interior surface of the reactor. In film deposition operations having long durations or employing high deposition temperatures, such as during the deposition of relatively thick epitaxial layers, film deposition on interior wall surfaces may lead to contamination and/or chamber failure in the event that the reactor walls devitrify.

Various countermeasures exist to manage the deposition of film onto interior surfaces of the reactor walls during film deposition operations. For example, sequencing of substrates through the reactor for film deposition may be interrupted for removal of film that may have been deposited on interior surfaces of the reactor walls, such as by flowing an etchant through the reactor between film deposition operations. Deposition operations requiring relatively long deposition times may be divided into the two or more deposition events. Dividing the deposition operation into two or more deposition events allows the substrate to be removed subsequent to the first deposition event, the substrate removed from the reactor such that accumulated film may be removed from the interior surfaces of the reactor walls, and the substrate returned to the reactor for the subsequent deposition event.

Such systems and methods have generally been considered acceptable for their intended purpose. However, there remains a need in the art for improved reaction chamber cooling, semiconductor processing systems, and methods of cooling reaction chambers. The present disclosure provides a solution to this need.

SUMMARY OF THE DISCLOSURE

A reflector is provided. The reflector includes a reflector body arranged to overlap a reaction chamber of a semiconductor processing system. The reflector body has a grooved surface and a reflective surface extending between a first longitudinal edge of the reflector body and a second longitudinal edge of the reflector body, the reflective surface spaced apart from the grooved surface by a thickness of the reflector body. The grooved surface and the reflective surface define a pyrometer port, two or more elongated slots, and two or more shortened extending through the thickness of the reflector body. The shortened slots outnumber the elongated slots to bias issue of a coolant against the reaction chamber toward the second longitudinal edge of the reflector body.

In addition to one or more of the features described above, or as an alternative, further examples may include that shortened slot has a shortened slot length, that the elongated slot may have an elongated slot length, and that the shortened slot length may be between about 10% and about 60% of the elongated slot length.

In addition to one or more of the features described above, or as an alternative, further examples may include that the two or more shortened slots define three or more unequal shortened slot lengths.

In addition to one or more of the features described above, or as an alternative, further examples may include that one or more of the elongated slots separates the two or more shortened slots from the pyrometer port.

In addition to one or more of the features described above, or as an alternative, further examples may include that one or more of the elongated slots separates the two or more shortened slots from a lateral edge of the reflector body.

In addition to one or more of the features described above, or as an alternative, further examples may include that a first of the two or more shortened slots longitudinally overlaps a second of the two or more shortened slots.

In addition to one or more of the features described above, or as an alternative, further examples may include that a first of the two or more shortened slots is longitudinally offset from a second of the two or more shortened slots.

In addition to one or more of the features described above, or as an alternative, further examples may include that at least one of the two or more shortened slots longitudinally overlaps the pyrometer port.

In addition to one or more of the features described above, or as an alternative, further examples may include that a first of the shortened slots is laterally offset from a second of the shortened slots.

In addition to one or more of the features described above, or as an alternative, further examples may include that the grooved surface defines two or more expansion grooves extending in parallel with one another.

In addition to one or more of the features described above, or as an alternative, further examples may include that two or more of the elongated slots are parallel to the two or more expansion grooves.

In addition to one or more of the features described above, or as an alternative, further examples may include that the two or more shortened slots are parallel to the two or more expansion grooves.

In addition to one or more of the features described above, or as an alternative, further examples may include that the reflective surface has a reflective coating.

In addition to one or more of the features described above, or as an alternative, further examples may include that the reflective coating includes gold.

In addition to one or more of the features described above, or as an alternative, further examples may include an intermediate layer coupling the reflective coating to the reflector body.

In addition to one or more of the features described above, or as an alternative, further examples may include that the intermediate layer includes nickel.

In addition to one or more of the features described above, or as an alternative, further examples may include that a first of the two or shortened slots is spaced apart from a second of the two or more shortened slots by one or more of the two or more expansion grooves.

In addition to one or more of the features described above, or as an alternative, further examples may include that one or more of the two or more shortened slots is separated from the pyrometer port by two or more expansion grooves.

In addition to one or more of the features described above, or as an alternative, further examples may include that the reflective surface includes two or more concave surface portions extending in parallel with one another.

In addition to one or more of the features described above, or as an alternative, further examples may include that the two or more concave surface portions define a concave profile between a first lateral edge and a second lateral edge of the reflector body.

In addition to one or more of the features described above, or as an alternative, further examples may include that a first of the two or more shortened slots extends through a first of the two of concave surface portions, and that a second of the two or of shortened slots may extend through a second of the two or more concave surface portions.

In addition to one or more of the features described above, or as an alternative, further examples may include that a first of the two or more shortened slots is spaced apart from a second of the two or more shortened slots by one or more of the two or more concave surface portions.

In addition to one or more of the features described above, or as an alternative, further examples may include that the pyrometer port is a first pyrometer port, and that the grooved surface and the reflector surface define a second pyrometer port extending through the thickness of the reflector body.

In addition to one or more of the features described above, or as an alternative, further examples may include that one or more of the two or more shortened slots longitudinally overlaps the first pyrometer port and the second pyrometer port.

In addition to one or more of the features described above, or as an alternative, further examples may include two or more of the shortened slots are longitudinally offset from the second pyrometer port.

A cooling kit is provided. The cooling kit includes a top reflector as described above, an injection end side reflector, and an exhaust end side reflector. The injection end side reflector has a louvered portion. The exhaust end side reflector and the injection end side reflector are substantially equivalent in height to one another.

In addition to one or more of the features described above, or as an alternative, further examples of the cooling kit may include that the cooling kit is arranged to maintain a pressure differential across the top reflector and the injection end side reflector that is less than about 20 torr, or is less than about 15 torr, or that is less than about 10 torr, or is between about 2 torr and about 12 torr.

In addition to one or more of the features described above, or as an alternative, further examples of the cooling kit may include that the cooling kit is arranged to maintain a peak temperature on an interior surface of a top wall of the reaction chamber that is less than about 850 degrees Celsius, or is less than about 800 degrees Celsius, or is less than about 750 degrees Celsius, or is less than about 700 degrees Celsius, or is less than about 650 degrees Celsius, or is less than about 600 degrees Celsius, or is between about 400 degrees Celsius and about 600 degrees Celsius.

In addition to one or more of the features described above, or as an alternative, further examples of the cooling kit may include a blower having a rating that is between about 100 standard cubic feet minute (SCFM) and about 10 SCFM, or is between about 80 SCFM and about 20 SCFM, or is between about 60 SCFM and about 40 SCFM.

A semiconductor processing system is provided. The semiconductor processing system includes a reaction chamber, a susceptor, a heater element, and a reflector as described above. The susceptor is supported within an interior of the reaction chamber. The heater element is supported above the reaction chamber. The reflector is supported above the reaction chamber such that the is radiantly coupled to the susceptor by the reflective surface of reflector body and a top wall of the reaction chamber.

A film deposition method is provided. The method includes receiving a coolant at a top reflector supported above a reaction chamber and flowing the coolant through a plurality of elongated slots and a plurality of shortened slots extending through the top reflector. The coolant is distributed across an exterior of the reaction chamber using the plurality of elongated slots and the plurality of shortened slots, and the distribution of the coolant biased across the exterior of the reaction chamber using the plurality of shortened slots.

In addition to one or more of the features described above, or as an alternative, further examples of the method may include that the plurality of shortened slots bias distribution the coolant toward an injection end of the reaction chamber.

In addition to one or more of the features described above, or as an alternative, further examples of the method may include that the plurality of shortened slots bias distribution the coolant toward an exhaust end of the reaction chamber.

In addition to one or more of the features described above, or as an alternative, further examples of the method may include that depositing the film further comprises rotating the substrate as the precursor flows across the substrate and that the plurality of shortened slots bias distribution the coolant toward an advancing portion of the substrate relative to the flow of precursor across the substrate.

In addition to one or more of the features described above, or as an alternative, further examples of the method may include that depositing the film further comprises rotating the substrate as the precursor flows across the substrate, and that the plurality of shortened slots bias distribution the coolant toward a retreating portion of the substrate relative to the flow of precursor across the substrate.

This summary is provided to introduce a selection of concepts in a simplified form. These concepts are described in further detail in the detailed description of examples of the disclosure below. This summary is not intended to identify key features or essential features of the claimed subject matter, nor is it intended to be used to limit the scope of the claimed subject matter.

BRIEF DESCRIPTION OF THE DRAWING FIGURES

While the specification concludes with claims particularly pointing and distinctly claiming what are regarded as embodiments of the present disclosure, the advantages of embodiments of the present disclosure may be more readily ascertained from the description of certain examples of the embodiments of the present disclosure when read in conjunction with the accompanying drawings, in which:

FIGS. 20 and 21 is a block diagram of a film deposition method, showing operations of the method according to an illustrative and non-limiting example of the method.

It will be appreciated that elements in the figures are illustrated for simplicity and clarity and have not necessarily been drawn to scale. For example, the relative size of some of the elements in the figures may be exaggerated relative to other elements to help improve understanding of illustrated embodiments of the present disclosure.

DETAILED DESCRIPTION OF EXEMPLARY EMBODIMENTS

Figure 1:
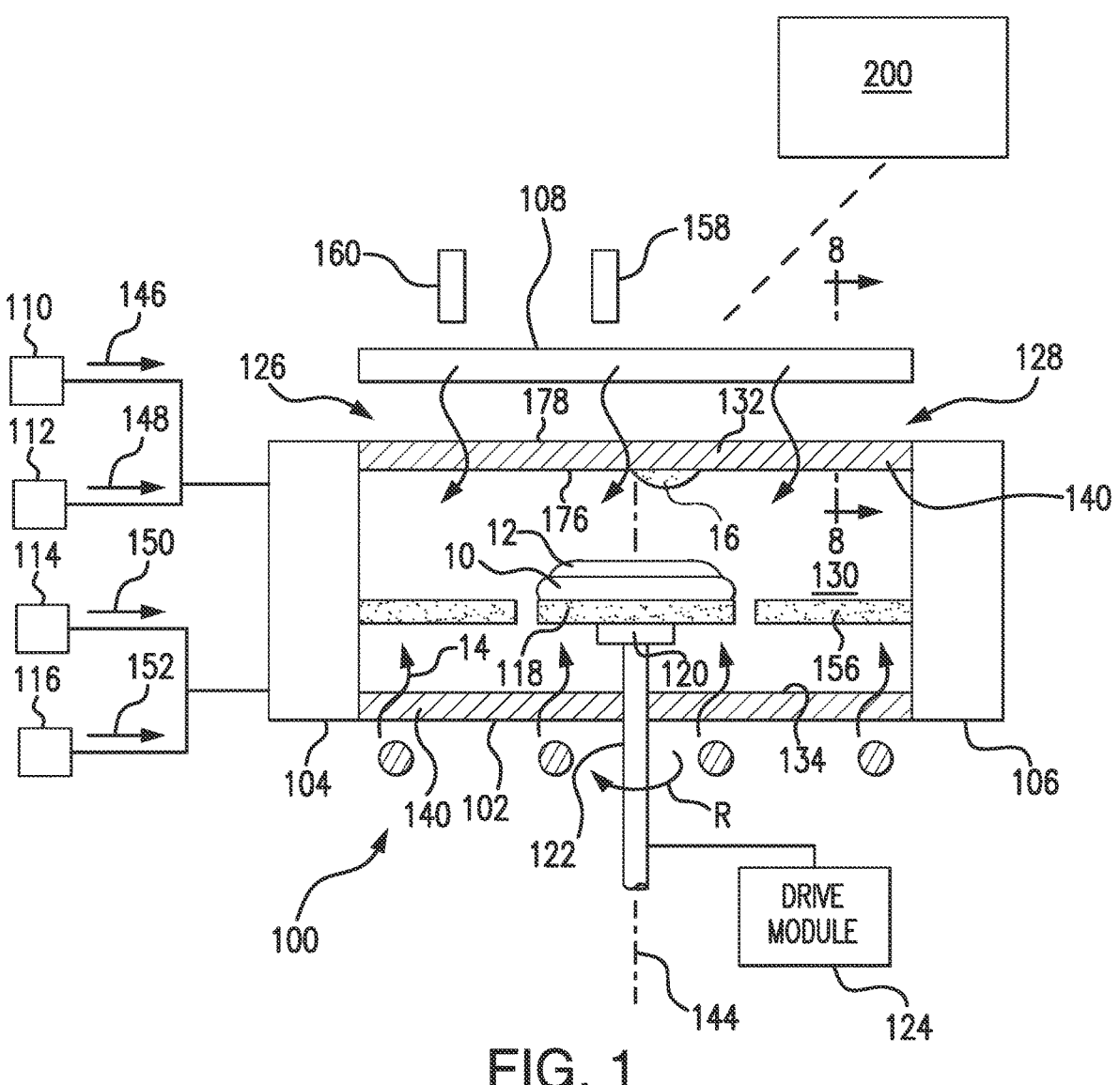
FIG. 1 is a schematic view of a semiconductor processing system with a reaction chamber and a cooling kit, showing the cooling kit exploded away from the reaction chamber.

Reference will now be made to the drawings wherein like reference numerals identify similar structural features or aspects of the subject disclosure. For purposes of explanation and illustration, and not limitation, a partial view of an example of a semiconductor processing system with a cooling kit including a top reflector in accordance with the present disclosure is shown in FIG. 1 and is designated generally by reference character 100. Other examples top reflectors, cooling kits, and semiconductor processing systems, or aspects thereof, are provided in FIGS. 2-21, as will be described. The systems and methods described herein can be used to control temperature on reaction chamber interior wall surfaces during the deposition of films onto substrates using chemical vapor deposition (CVD) techniques, such as thick epitaxial films for power electronics devices like insulated gate bipolar transistor devices, through the present disclosure is not limited to power electronics devices or to thick epitaxial films in general.

Referring to FIG. 1, the semiconductor processing system 100 is shown. The semiconductor processing system 100 includes a reaction chamber 102, an injection flange 104, an exhaust manifold 106, and a heater element 108. The semiconductor processing system 100 also includes a first precursor source 110, one or more second precursor source 112, a purge/carrier gas source 114, and a halide source 116. As shown and described herein, the semiconductor processing system 100 further includes a susceptor 118, a susceptor support member 120, a shaft 122, and a drive module 124. Although a particular arrangement of the reaction chamber 102 is shown and described, e.g., a cold wall crossflow-type reaction chamber, it is to be understood and appreciated that semiconductor processing systems having other types of reaction chambers may also benefit from the present disclosure.

The reaction chamber 102 has an injection end 126, an opposite exhaust end 128, and an interior 130. The interior 130 of the reaction chamber 102 is bounded by a top wall 132 extending between the injection end 126 and the exhaust end 128 of the reaction chamber 102, a bottom wall 134 below the top wall 132 and extending between the injection end 126 and the exhaust end 128 of the reaction chamber 102, a first side wall 136 (shown in FIG. 4) coupling lateral edges of the top wall 132 and the bottom wall 134 to one another, and a laterally opposite second side wall 138 (shown in FIG. 4) coupling opposite lateral edges of the top wall 132 and the bottom wall 134 to one another. In certain examples, the reaction chamber 102 may be formed from a transparent material 140, e.g., a glass material transmissive to electromagnetic radiation emitted by the heater element 108, such that a substrate 10 supported within the reaction chamber 102 may be heated with an externally located heater element 108 or heater element array (shown in FIG. 8). In accordance with certain examples, the reaction chamber 102 may be formed from quartz. In accordance with certain examples, the reaction chamber 102 may have ribs extending outward from the walls and about the reaction chamber 102 to provide structural support to the reaction chamber 102 and/or allow the interior 130 of the reaction chamber 102 to be maintained at relatively low pressure relative to the environment outside of the reaction chamber 102.

The susceptor 118 is arranged within the interior 130 of the reaction chamber 102 and is supported by the susceptor support member 120. It is contemplated that the susceptor 118 be arranged along a rotation axis 144, overlay the susceptor support member 120, and be fixed in rotation relative to the susceptor support member 120. The susceptor support member 120 is fixed in rotation relative to the shaft 122. The shaft 122 is in turn supported for rotation R about the rotation axis 144, extends through the bottom wall 134 of the reaction chamber 102, and couples the susceptor 118 and the susceptor support member 120 to drive module 124. The drive module 124 is operably connected to the susceptor 118 by the shaft 122 and the susceptor support member 120, and is configured to rotate the susceptor 118 via the shaft 122 and the susceptor support member 120 about the rotation axis 144 during the deposition of a film 12 onto the substrate 10. In certain examples, the substrate 10 may include a wafer, such as a semiconductor wafer. In accordance with certain examples, the film 12 may be an epitaxial film, such as a silicon or a silicon-germanium film. It is also contemplated that, in accordance with certain examples, the film 12 may be a thick epitaxial film formed during the fabrication of a power electronics device, such as an insulated gate bipolar transistor semiconductor device. As used herein the term 'thick' refers layers having a thickness that is greater than 25 microns, or is greater than 50 microns, or is greater than 75 microns, or is greater than 100 microns, or is between about 25 microns and about 100 microns.

The exhaust manifold 106 is connected to the exhaust end 128 of the reaction chamber 102 and is configured to couple the reaction chamber 102 to an exhaust source, such as a scrubber. In certain examples, the reaction chamber 102 may have an exhaust flange extending outward from and about the walls of the reaction chamber 102 and the exhaust manifold 106 may be connected to the exhaust flange. The injection flange 104 is connected to the injection end 126 of the reaction chamber 102 and couples the first precursor source 110, one or more second precursor source 112, the purge/carrier gas source 114, and the halide source 116 to the reaction chamber 102. In certain examples, the reaction chamber 102 may have an injection flange extending outward from and about the injection end 126 of the reaction chamber 102 and the injection flange 104 may be connected to the injection flange. One or more of the reaction chamber 102, the injection flange 104, and the exhaust manifold 106 may be as shown and described in U.S. Patent Application Publication No. 2010/0116207 A1 to Givens et al., filed on Nov. 5, 2019, the contents of which is incorporated herein by reference in its entirely.

The first precursor source 110 is fluidly coupled to the reaction chamber 102 by the injection flange 104 and is configured to provide a first precursor 146 to the reaction chamber 102. In certain examples, the first precursor 146 may include a silicon-containing precursor. Examples of suitable silicon-containing precursors include silane ($SiH_4$), dichlorosilane ($H_2SiCl_2$), trichlorosilane ($SiHCl_3$), and higher order silane compounds, such as tetramethylsilane ($Si(CH_3)_4$) by way of non-limiting example.

The one or more second precursor source 112 is fluidly coupled to the reaction chamber 102 by the injection flange 104 and is configured to provide one or more second precursor 148 to the reaction chamber 102. In certain examples, the one or more second precursor 148 may include a dopant, such as an n-type and/or a p-type dopant-containing precursors. In accordance with certain examples, the one or more second precursor 148 may include a germanium precursor. Examples of suitable germanium precursors include germane ($GeH_4$), germanium tetrafluoride ($GeF_4$), and tributylgermanium hydride ($[CH_3(CH_2)_3]_3$ GeH).

The purge/carrier gas source 114 is fluidly coupled to the reaction chamber 102 by the injection flange 104 and is configured to provide a purge/carrier gas 150 to the reaction chamber 102. In certain examples, the purge/carrier gas 150 may include hydrogen ($H_2$), helium (He), nitrogen ($N_2$), argon (Ar), krypton (Kr), or a mixture thereof.

The halide source 116 is fluidly coupled to the interior 130 of the reaction chamber 102 by the injection flange 104 and is configured to provide a halide 152 to the reaction chamber. In certain examples, the halide 152 may include chlorine. In this respect the halide 152 may include hydrochloric acid (HCl) or chlorine ($Cl_2$).

Deposition of the film 12 onto the substrate 10 is accomplished by supporting the substrate 10 within the reaction chamber 102 on the susceptor 118, heating the substrate 10 to a predetermined film deposition temperature, rotating the substrate 10 using the susceptor 118 about the rotation axis 144, and flowing the first precursor 146 and/or the second precursor 148 across the substrate 10. As the first precursor 146 and/or the second precursor 148 flow across the substrate 10 the film 12 deposits onto the substrate 10 according to temperature of the substrate 10. It is contemplated that heating of the substrate 10 be accomplished by a heating element or heating element array positioned outside of the reaction chamber 102, e.g., the heater element 108 or a heater element array 174 (shown in FIG. 8). In the illustrated example, the heater element 108 or the heater element array 174 is arranged above the top wall 132 of the reaction chamber 102 and is radiantly coupled to the susceptor 118 (and the substrate 10) by the walls of the reaction chamber 102. It is contemplated that a top reflector 202 (shown in FIG. 2) supported above the heater element 108 cooperate with the heater element 108 to radiantly heat the susceptor 118 and the substrate 10, the top reflector 202 reflecting electromagnetic radiation emitted from the heater element 108 is a direction opposite the reaction chamber 102 toward the reaction chamber 102. In this respect the reaction chamber 102 may be arranged as shown and described in U.S.

Patent Application Publication No. 2018/0363139 A1 to Rajavelu et al., the contents of which are incorporated herein by reference in their entirety.

As will be appreciated by those of skill in the art in view of the present disclosure, temperature on an interior wall surfaces in some reaction chambers may increase during film deposition. For example, wall temperature may increase during the course of film deposition due to the transmissivity of the material forming the wall. Wall temperature may also increase due to the collateral deposition of film onto interior surfaces of the reaction chamber walls during the deposition of film onto the targeted substrate. And wall temperature may be subjected to localized heating due to the flow pattern precursor through interior of the reaction chamber, e.g., at locations bounding regions where precursor flow slots within the interior of the reaction chamber. While generally manageable through external cooling, excessive wall temperatures may, during some deposition operations, cause wall temperature to reach leaves where the transmissive material forming the walls may be subject to devitrification—potentially causing the introduction of contamination and/or failure of the reaction chamber. To limit (or eliminate) the risk of devitrification, excessive wall temperature, and temperature variation on interior surfaces of the walls of the reaction chamber 102, the cooling kit 200 is provided.

Figure 2:
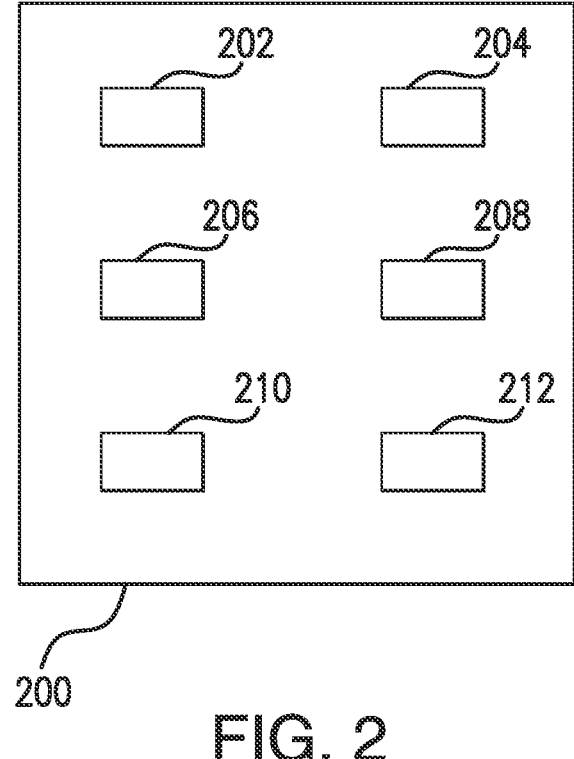
FIG. 2 is a block diagram of the cooling kit of FIG. 1, schematically showing a top reflector, injection end sides reflectors and exhaust end side reflectors, and a blower according to a non-limiting example of the cooling kit.

With reference to FIG. 2, the cooling kit 200 is shown. The cooling kit 200 is arranged to maintain a peak temperature on an interior surface of a top wall of the reaction chamber 102 that is less than about 850 degrees Celsius, or is less than about 800 degrees Celsius, or is less than about 750 degrees Celsius, or is less than about 700 degrees Celsius, or is less than about 650 degrees Celsius, or is less than about 600 degrees Celsius, or is between about 400 degrees Celsius and about 600 degrees Celsius and in this respect includes the top reflector 202, a first injection end side reflector 204, and a first exhaust end side reflector 206. The cooling kit 200 also includes a second injection end side reflector 208, a second exhaust end side reflector 210, and a blower 212. The reflectors; e.g., the top reflector 202, the first injection end side reflector 204, the first exhaust end side reflector 206, the second injection end side reflector 208, and the second exhaust end side reflector 210; are configured to limit resistance (i.e., static flow drop) to flow of the coolant 14 (shown in FIG. 3) across the exterior of the reaction chamber 102 (shown in FIG. 1). The blower 212 is configured to provide a relatively high mass flow of the coolant 14 across the exterior of the reaction chamber 102 and across the reflectors. The top reflector 202 is further configured to distribute coolant across the top wall 132 (shown in FIG. 1) of the reaction chamber 102 to limit variation of temperature across an interior surface 176 (shown in FIG. 1) of the top wall 132 of the reaction chamber 102 during deposition of the film 12 (shown in FIG. 1) onto the substrate 10 (shown in FIG. 1).

Figure 3:
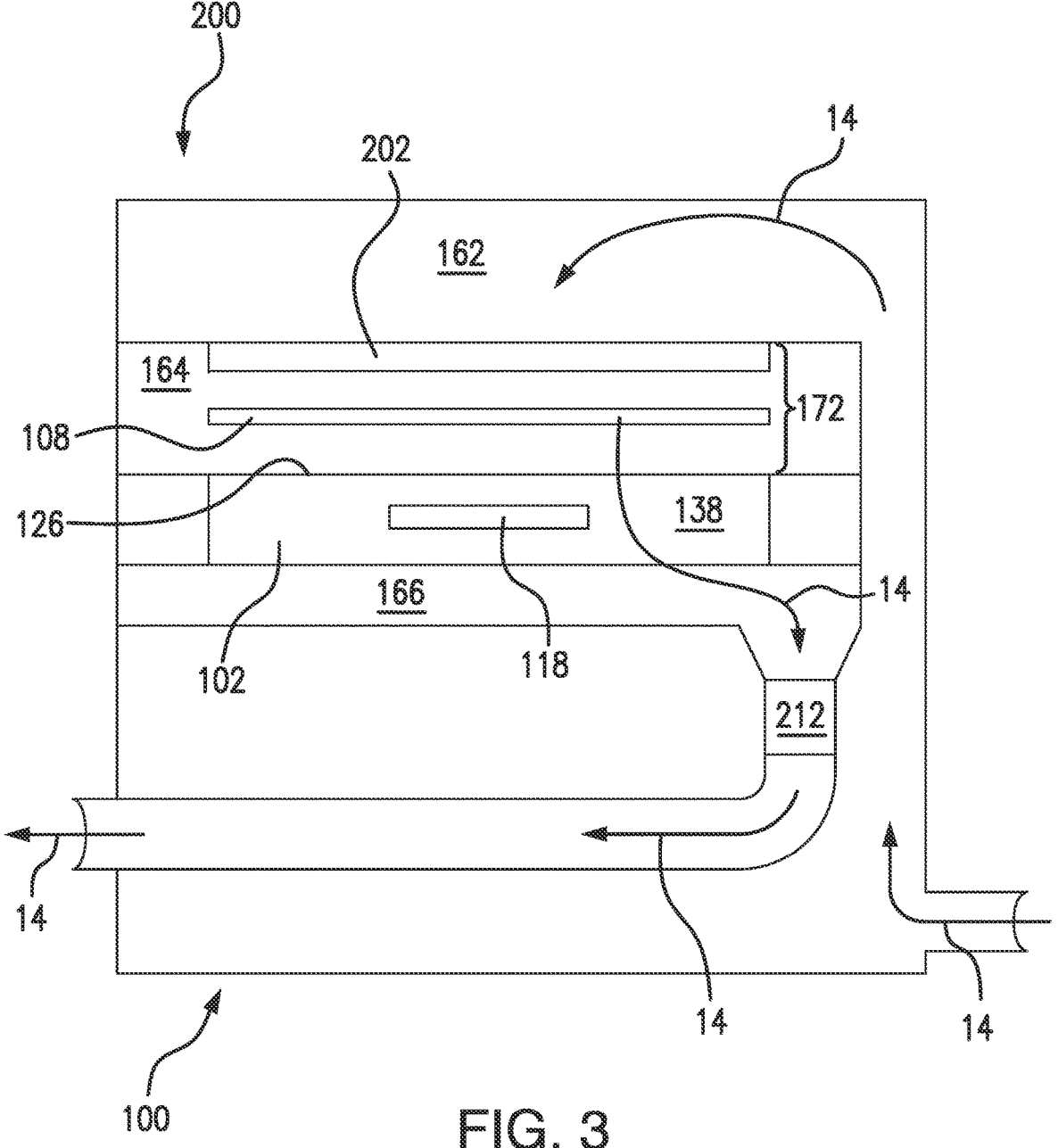
FIG. 3 is cross-sectional side view of a portion of the semiconductor processing system of FIG. 1, showing the top reflection supported above the reaction chamber and the blower drawing coolant through the top reflector and across the exterior of the reaction chamber.

With reference to FIG. 3, the reaction chamber 102 and a portion of the cooling kit 200 including the top reflector 202 and the blower 212 are shown. The susceptor 118 is arranged within the interior of the reaction chamber 102 and is arranged to support the substrate 10 (shown in FIG. 1) during the deposition of the film 12 (shown in FIG. 1) onto the substrate 10. The heater element 108 or heater element array 174 (shown in FIG. 8) is supported above the reaction chamber 102. The top reflector 202 is supported above the heater element 108 and is spaced apart from the reaction chamber 102 by the heater element 108. The blower 212 is arranged below the reaction chamber 102 and is in pneumatic communication with the reaction chamber 102 via the top reflector 202 for flowing a coolant 14 across the exterior of the reaction chamber 102.

It is contemplated that the heater element 108 longitudinally span, at least in part, the reaction chamber 102. In this respect the heater element 108 extends longitudinally across the top wall 132 (shown in FIG. 1) between the injection end 126 and the exhaust end 128 of the reaction chamber 102, i.e., in the general direction of precursor flow through the reaction chamber 102 between the injection flange 104 and the exhaust manifold 106, for radiantly communicating heat into the interior 130 of the reaction chamber 102. In certain examples, the heater element 108 may longitudinally span the one or more of the susceptor 118, an outer ring 156 (shown in FIG. 1) extending about the susceptor 118, and the reaction chamber 102. In accordance with certain examples, the heater element 108 may include a filament supported within a cylindrical enclosure be one of an array of cylindrical heater elements lateral spaced from one another over the reaction chamber 102 and extending longitudinally above the reaction chamber 102. The heater element 108 or the heater element array 174 (shown in FIG. 8) may be as shown and described in U.S. Pat. No. 6,781,291 to Michael Halpin, issued on Aug. 24, 2004, the contents of which is incorporated herein by reference in its entirety.

Figure 4:
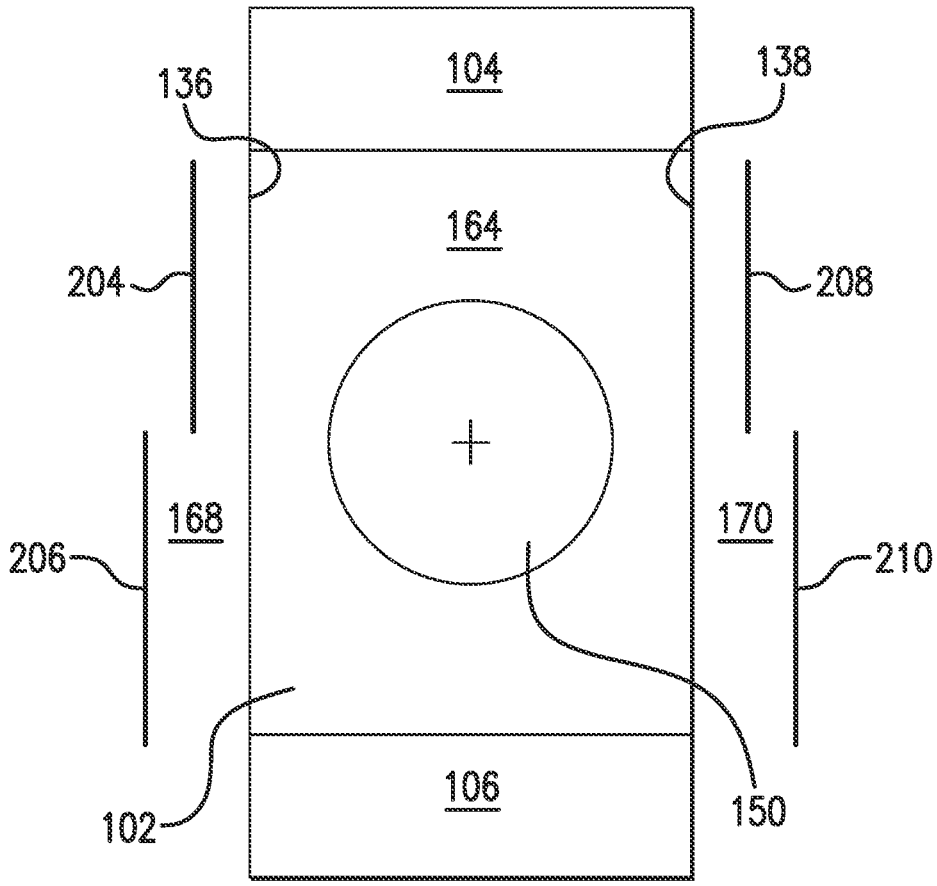
FIG. 4 is a plan view of a portion of the semiconductor processing system of FIG. 1 including the reaction chamber and side reflectors, showing the injection end side reflectors and the exhaust end side reflectors arranged on laterally opposite sides of the reaction chamber.
Figure 5:
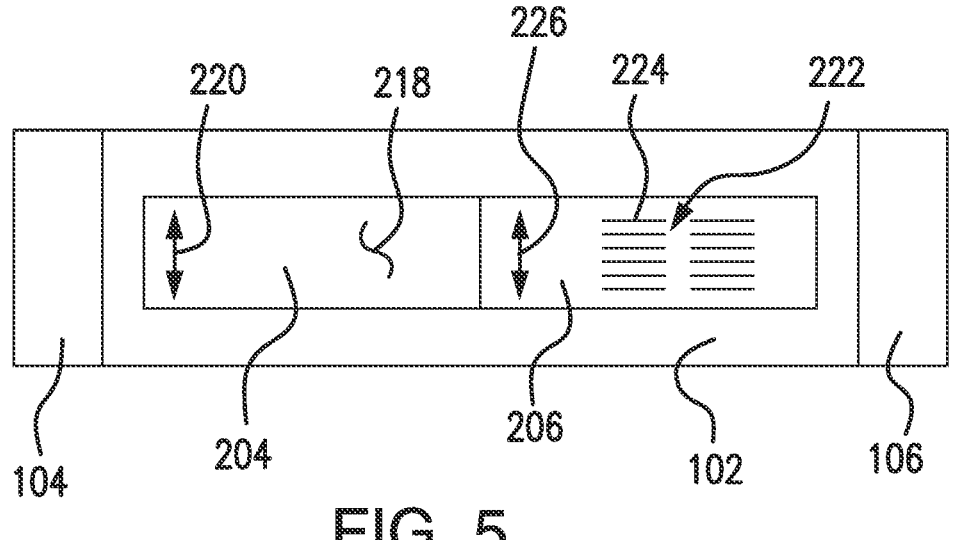
FIG. 5 is a side view of a portion of the semiconductor processing system of FIG. 1 including the reaction chamber and side reflectors, showing heights of the side reflectors and a louvered portion of the exhaust end side reflector.

With reference to FIG. 4, the reaction chamber 102 and a portion of the cooling kit 200 including the side reflectors; i.e., the first injection end side reflector 204, the first exhaust end side reflector 206, the second injection end side reflector 208, and the second exhaust end side reflector 210; are shown. The first injection end side reflector 204 and the second injection end side reflector 208 are arranged on laterally opposite sides of the injection end 126 of the reaction chamber 102. The first exhaust end side reflector 206 and the second exhaust end side reflector 210 are arranged on laterally opposite sides of the exhaust end 128 of the reaction chamber 102, and are longitudinally offset from the first injection end side reflector 204 and the second injection end side reflector 208 relative to the general direction of precursor flow through the reaction chamber 102 between the injection flange 104 and the exhaust manifold 106.

Pneumatic communication of the coolant 14 (shown in FIG. 3) is accomplished through a plurality of plenums defined between the reaction chamber 102 and the blower 212 (shown in FIG. 3). In this respect a supply plenum 162 (shown in FIG. 3) is defined between the blower 212 and the top reflector 202 (shown in FIG. 3), a top plenum 164 is defined between the top reflector 202 and the reaction chamber 102, and a return plenum 166 (shown in FIG. 3) is defined between the reaction chamber 102 and the blower 212. In further respect, a first lateral plenum 168 is defined between the reaction chamber 102 and the first injection end side reflector 204 and the first exhaust end side reflector 206, and a second lateral plenum 170 is defined between the second injection end side reflector 208 and the second exhaust end side reflector 210. It is contemplated that the supply plenum 162 pneumatically couple the blower 212 to the top reflector 202, that the top reflector 202 pneumatically couple the supply plenum 162 to the top plenum 164, and that the top plenum 162 pneumatically couple the top reflector 202 to the top wall 132 of the reaction chamber 102. It is also contemplated that the first lateral plenum 168 be pneumatically couple the top plenum 164 to the first injection end side reflector 204 and the first exhaust end side reflector 206, the second lateral plenum 170 pneumatically couple the top plenum 164 to the second injection end side reflector 208 and the second exhaust end side reflector 210, the first injection end side reflector 204 and the first exhaust end side reflector 206 pneumatically couple the first lateral plenum 168 to the return plenum 166, and that the second injection end side reflector 208 and the second exhaust end side reflector 210 pneumatically couple the second lateral plenum 170 to the return plenum 166. The return plenum 166 is in turn pneumatically coupled to the blower 212. As will be appreciated by those of skill in the art in view of the present disclosure, although shown and described herein as a closed loop cooling arrangement, it is to be understood and appreciated that an open loop cooling arrangement may also be employed, e.g., the blower 212 receiving makeup air from a source external to the coolant loop, and remain within the scope of the present disclosure.

To cool the reaction chamber 102, the blower 212 makes up the flow of the coolant 14 provided to the supply plenum 162 using heated coolant received from the return plenum 166 and/or from a makeup duct. From the supply plenum 162, the coolant 14 flows through the top reflector 202 and onto an exterior surface 178 of the top wall 132 of the reaction chamber 102 through the top plenum 164, and thereafter flows across the exterior surface 178 into the first lateral plenum 168 and the second lateral plenum 170. As the coolant 14 flows across the exterior surface 178 of the top wall 132 of the reaction chamber 102 the coolant removes heat from the top wall 132, cooling the interior surface 176 of the reaction chamber 102.

From the first lateral plenum 168, a portion of the coolant 14 traverses the first injection end side reflector 204 and the first exhaust end side reflector 206, and flows therefrom into the return plenum 166. From the second lateral plenum 170, another portion of the coolant 14 traverses the second injection end side reflector 208 and the second exhaust end side reflector 210, and flows therefrom into the return plenum 166. From the return plenum 166, the coolant 14 returns to the blower 212 for recirculation across the exterior of the reaction chamber 102. In certain examples, one or more heat exchangers may be arranged along the flow path of the coolant 14, for example within ducting connecting the return plenum 166 and/or the supply plenum 162, as appropriate, to reject (sink) heat removed from the exterior of the reaction chamber 102.

As will be appreciated by those of skill in the art in view of the present disclosure, cooling capability of the semiconductor processing system 100 (shown in FIG. 1) is determined at least in part by the flow resistance presented by the reflectors of the cooling kit 200. As will also be appreciated by those of skill in the art in view of the present disclosure, cooling capability may be increased by limiting resistance of flow (e.g., by reducing static pressure drop) of the coolant 14 across the reaction chamber 102 and/or by increasing mass flow of the coolant 14 across the reaction chamber 102. The cooling kit 200 is configured to provide increased cooling capability to the reaction chamber 102 by (a) limiting resistance to flow of the coolant 14 presented by the reflectors, (b) providing relatively high mass flow rate of the coolant 14 across the exterior of the reaction chamber 102 using the blower 212, and (c) reducing variation in the temperature of the interior surface 176 (shown in FIG. 1).

In certain examples, the top reflector 202 may be separated from the top wall 132 of the reaction chamber 102 by a spacing distance 172 selected to limit resistance to flow of the coolant 14 between the supply plenum 162 and the top plenum 164. The spacing distance 172 may be less than 100 millimeters, or less than 90 millimeters, or less than 80 millimeters, or even less than 70 millimeters. The spacing distance 172 may, in certain examples, be selected to cooperate with slots, e.g., a plurality of elongated slots 214 (shown in FIG. 6) and a plurality of shortened slots (shown in FIG. 6), extending through the top reflector 202 to limit resistance to flow of the coolant 14 through the top reflector 202. In accordance with certain examples, the spacing distance 172 may between 50 millimeters and 150 millimeters, or between 70 and 125 millimeters, or between 80 millimeters and 100 millimeters. It is contemplated that spacing distances within these ranges may limit static pressure drop between the supply plenum 162 and the top plenum 164 to less than about 15 torr, or less that about 10 torr, or less than about 5 torr, or to between about 5 torr and about 15 torr. As will be appreciated by those of skill in the art in view of the present disclosure, spacing distances within these ranges also distributes electromagnetic radiation emitted by the heat lamps across the top wall of the reaction chamber, limiting (or eliminating) the tendency of hot spots to develop on the top wall of the reaction chamber immediately below individual heat lamps.

In certain examples, the first injection end side reflector 204 and/or the second injection end side reflector 208 may be configured to limit resistance to flow of the coolant between the first lateral plenum 168 and/or the second lateral plenum 170 and the return plenum 166. In this respect either (or both) the first injection end side reflector 204 and the second injection end side reflector 208 may have a planar body, e.g., a planar body 218. As will be appreciated by those of skill in the art in view of the present disclosure, employment of planar bodies may promote laminar flow the coolant 14 along the planar body 218 by limiting (or eliminating) the tendency of flow to otherwise stagnate along the plate body. In further respect, either (or both) the first injection end side reflector 204 and the second injection end side reflector 208 may have a height, e.g., a height 220, that is smaller than a height of the first side wall 136 of the reaction chamber 102. As will be appreciated by those of skill in the art in view of the present disclosure, limiting the height of the first injection end side reflector 204 and/or the second injection end side reflector 208 may limits the resistance presented to the coolant 14 as the coolant 14 flows between the first lateral plenum 168 and the return plenum 166.

In certain examples, the first injection end side reflector 204 and/or the second injection end side reflector 208 may have louvered portions, e.g., a louvered portion 222. In such examples the louvered portion 222 may have a plurality of louvers 224 thereon configured to both provide fluid communication between the first lateral plenum 168 and the return plenum 166 while limiting (if at all) reduction in reflectivity of the first injection end side reflector 204. In certain examples, the louvered portion 222 may define therethrough a louver array comprising 4 louvers, or 6 louvers, or 8 louvers, or more than 10 louvers, or between 4 louvers and 10 louvers. In accordance with certain examples, each of the louvers 224 may have a longitudinal length that is greater than 40 millimeters, or greater than 60 millimeters, or greater than 80 millimeters, or greater than 100, or that is between 40 millimeters and 100 millimeters. Each of the louvers 224 may have a vertical height that is greater than 3 millimeters, or is greater than 5 millimeters, or is greater than 7 millimeters, or is greater than 9 millimeters, or is between about 3 millimeters and about 9 millimeters. As will be appreciated by those of skill in the art in view of the present disclosure, the louvers 224 of the louvered portion 222 may reduce resistance to flow of the coolant 14 from the first lateral plenum 168 and/or the second lateral plenum 170 to the return plenum 166 without limiting the reflectivity of the first injection end side reflector 204 and/or the second injection end side reflector 108.

In certain examples, the first exhaust end side reflector 206 and/or the second exhaust end side reflector 210 may have a height, e.g., a height 226, that is smaller than a vertical height of the first side wall 136 of the reaction chamber 102. In accordance with certain examples, the height 226 may be substantially equivalent to the height 220 of the first injection end side reflector 204. As above, limiting height of the first injection end side reflector 204 and/or the second injection end side reflector 208 may limit resistance to flow of the coolant 14 from the first lateral plenum 168 and/or the second lateral plenum 170 to the return plenum 166. For example, static pressure drop between the first lateral plenum 168 and/or the second lateral plenum 170 and the return plenum 166 may be less than about 7 torr, or to less than about 5 torr, or to less than about 3 torr, or to between about 7 torr and about 3 torr. The pressure drop may be about 6 torr. As will be appreciated by those of skill in the art in view of the present disclosure, pressure drops within these ranges increase coolant velocity, improving cooling of the reaction chamber.

In certain examples, the blower 212 may be configured to both increase the mass flow rate of the coolant 14 across the exterior of the reaction chamber 102. The blower 212 may further be configured to cooperate with slots extending through the top reflector 202, e.g., the plurality of elongated slots 214 (shown in FIG. 6) and the plurality of shortened slots 216 (shown in FIG. 6), to distribute of the coolant 14 across the exterior surface 178 of the top wall 132 of the reaction chamber 102 to limit temperature variation on the interior surface 176 of the reaction chamber 102. For example, the blower 212 may have a rating that is greater than about 10 standard cubic feet minute (SCFM), or is greater than about 40 SCFM, or is greater than about 60 SCFM, or greater than about 100 SCFM, or is between about 10 SCFM and about 100 SCFM. With respect to coolant distribution, blowers with ratings within these ranges may cooperate with the slots extending through the top reflector 202, e.g., the plurality of elongated slots 214 and the plurality of shortened slots 216, to efficiently cool the top wall 132 of the reaction chamber 102 such that temperature range on the interior surface 176 of the top wall 132 runs between about 10 degrees Celsius and about 65 degrees Celsius cooler than nominally during film deposition, or between about 30 degrees Celsius and about 55 degrees Celsius, or event between about 35 degrees Celsius and about 50 degrees Celsius. In certain examples, the interior surface of 176 may run about 40 degrees Celsius cooler than nominally during film deposition. As will be appreciated by those of skill in the art in view of the present disclosure, temperature reductions within these ranges can limit (or eliminate) risk of devitrification of the quartz forming the reaction chamber during prolonged deposition operations, enabling the reaction chamber to be employed to deposit thick epitaxial layers on substrates.

Figure 6:
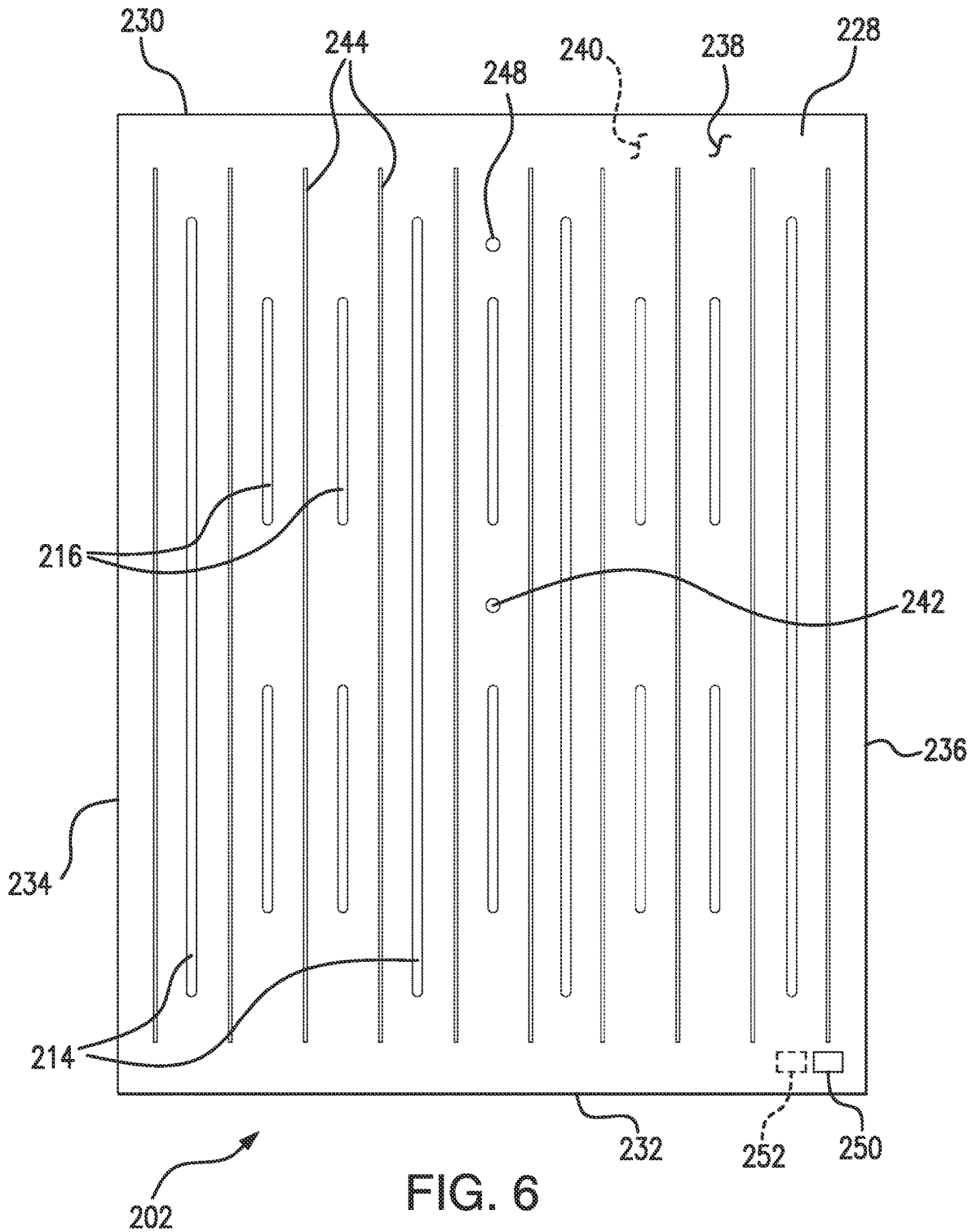
FIGS. 6-8 are plan and end views of the top reflector of the cooling kit of FIG. 1 according to an example, showing a grooved surface with a plurality of shortened slots separating a pyrometer port from laterally opposite sides of the reflector.
Figure 7:
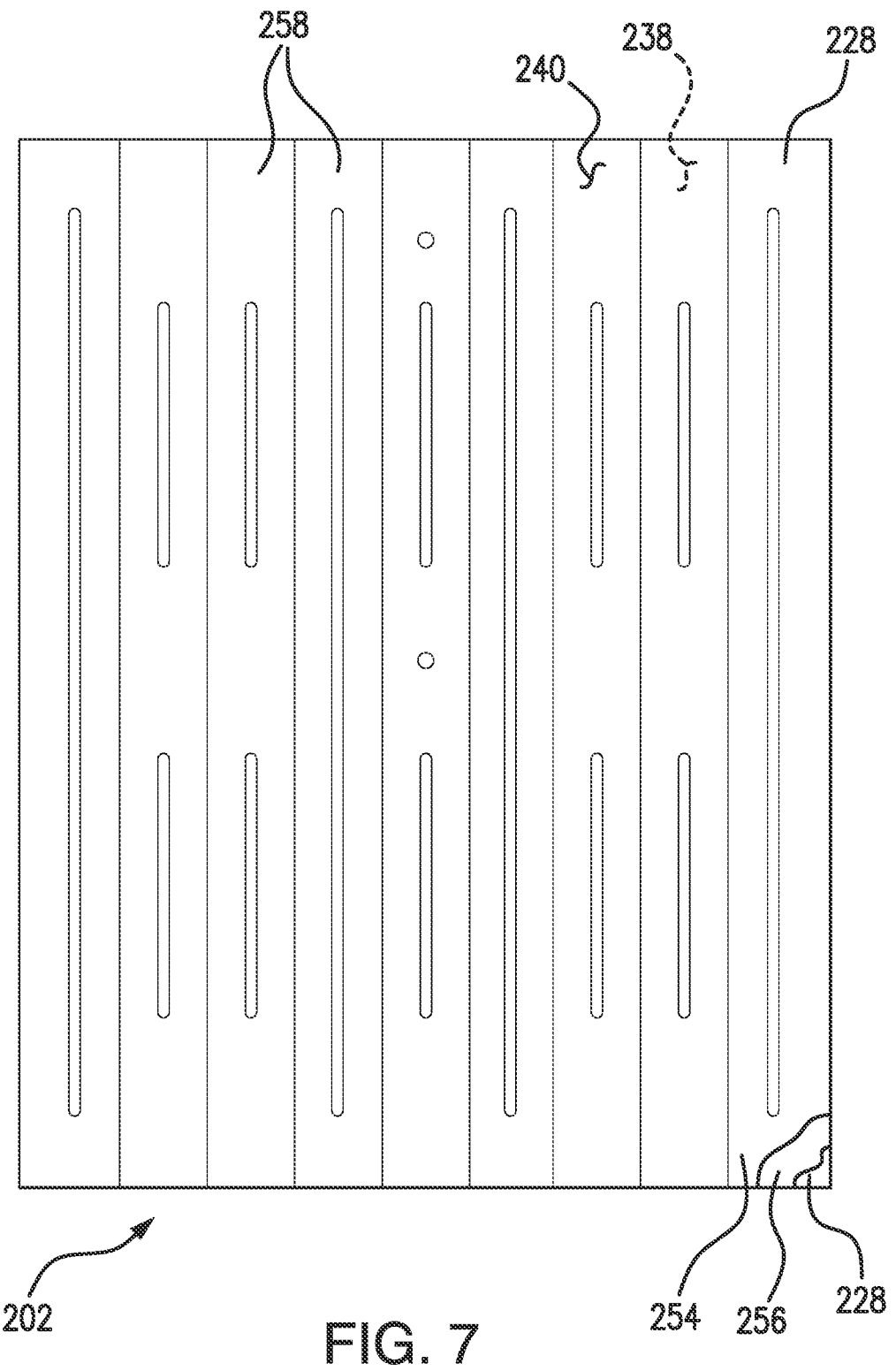
Figure 8:
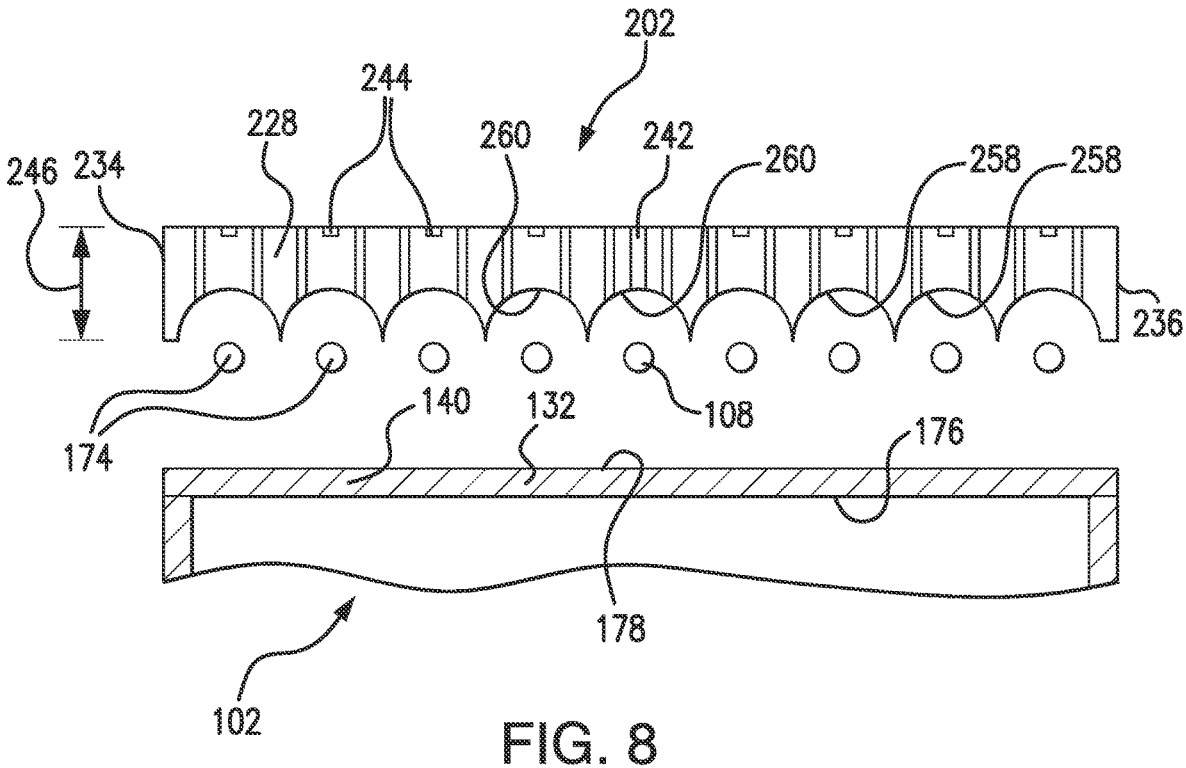

With reference to FIGS. 6-8, the top reflector 202 is shown according to an example. As shown in FIG. 6, the top reflector 202 is configured to overlap the reaction chamber 102 (shown in FIG. 1) and includes a reflector body 228. The reflector body 228 has a first longitudinal edge 230, a second longitudinal edge 232, a first lateral edge 234, a second lateral edge 236, a grooved surface 238, and a reflective surface 240. The first longitudinal edge 230 and the second longitudinal edge 232 are located at longitudinally opposite ends of the reflector body 228, and are spaced apart from one another by a longitudinal length of the reflector body 228. The first lateral edge 234 and the second lateral edge 236 connect the first longitudinal edge 230 and the second longitudinal edge 232, and are spaced apart from one another by a lateral width of the reflector body 228. It is contemplated that the first longitudinal edge 230 overlay the injection end 126 (shown in FIG. 1) of the reaction chamber 102 (shown in FIG. 1) and that the second longitudinal edge 232 overlay the exhaust end 128 (shown in FIG. 1) of the reaction chamber 102 when the top reflector 202 is supported above the reaction chamber 102. It is also contemplated that the heater element 108 (shown in FIG. 1) be supported between the reaction chamber 102 and top reflector 202 when the top reflector 202 is supported above the reaction chamber 102, the heater element 108 extending longitudinally between the first longitudinal edge 230 and the second longitudinal edge 232.

The grooved surface 238 of the reflector body 228 is longitudinally bounded by the first longitudinal edge 230 and the second longitudinal edge 232 of the reflector body 228, is laterally bounded by the first lateral edge 234 and the second lateral edge 236 of the reflector body 228, and defines therein a pyrometer port 242 and a plurality of expansion grooves 244 therein. The pyrometer port 242 extends through a thickness 246 (shown in FIG. 7) of the reflector body 228, and is configured to optically couple the pyrometer 158 (shown in FIG. 1) to the reaction chamber 102 (shown in FIG. 1). As will be appreciated by those of skill in the art in view of the present disclosure, optical coupling of the pyrometer 158 allows the pyrometer 158 to report temperature of the reaction chamber 102, the susceptor 118 (shown in FIG. 1), and/or the substrate 10 (shown in FIG. 1) supported on the susceptor 118. The reported temperature may in turn be employed to control temperature within the reaction chamber 102 and/or of the walls of the reaction chamber 102 during deposition of the film 12 (shown in FIG. 1) onto the substrate 10.

In certain examples, the pyrometer port 242 may be a first pyrometer port 242 and the grooved surface 238 may define therein one or more second pyrometer port 248. In such examples the one or more second pyrometer port 248 may be similar to the first pyrometer port 242 and additionally configured to optically couple one or more second pyrometer, e.g., a second pyrometer 160 (shown in FIG. 1), to the reaction chamber 102. The second pyrometer port 248 may be longitudinally offset from the first pyrometer port 242. One or more of the plurality of shortened slots 216 may separate the one or more second pyrometer port 248 from the first pyrometer port 242. As will be appreciated by those of skill in the art in view of the present disclosure, examples of the top reflector 202 having one or more second pyrometer port allow for monitoring temperature of the reaction chamber 102 at one or more second location, improving the ability to control temperature of the substrate 10 (shown in FIG. 1) and the reaction chamber 102 during deposition of the film 12 (shown in FIG. 1) onto the substrate 10. Although shown as having three (3) pyrometer ports, it is to be understood and appreciated that examples of the reflector body 228 may have fewer or more than three (3) pyrometer ports and remain within the scope of the present disclosure.

The plurality of expansion grooves 244 are defined within the grooved surface 238 of the reflector body 228 and are configured to limit deformation of the reflector body 228 due to heating. In this respect the plurality of expansion grooves 244 extend partially through the thickness 246 (shown in FIG. 7) of the reflector body 228. In further respect, it is contemplated that the plurality of expansion grooves 244 separate the pyrometer port 242 from the first lateral edge 234 and the second lateral edge 236, be evenly spaced from one another between the first lateral edge 234 and the second lateral edge 236 of the reflector body 228, and extend between the first longitudinal edge 230 and the second longitudinal edge 232 of the reflector body 228. In certain examples, the plurality of expansion grooves 244 may extend in parallel with one another. In accordance with certain examples, the plurality of expansion grooves 244 may be substantially orthogonal in relation to either (or both) the first longitudinal edge 230 and the second longitudinal edge 232. It is also contemplated that, in accordance with certain examples, the plurality of expansion grooves 244 may be substantially parallel to either (or both) the first lateral edge 234 and the second lateral edge 236. Although shown as having eleven (11) expansion grooves 244, it is to be understood and appreciated that examples of the reflector body 228 may have fewer or more than eleven (11) expansion grooves and remain within the scope of the present disclosure.

As shown in FIG. 7, the reflective surface 240 is longitudinally bounded by the first longitudinal edge 230 and the second longitudinal edge 232 of the reflector body 228, is laterally bounded by the first lateral edge 234 and the second lateral edge 236 of the reflector body 228. It is contemplated that the plurality of elongated slots 214 and the plurality of shortened slots 216 be defined in the reflective surface 240, that the reflective surface 240 have a reflectivity 250 that is greater than a reflectivity 252 of the grooved surface 238, and that plurality of elongated slots 214 and the plurality of shortened slots 216 fluidly couple the grooved surface 238 to the reflective surface 240 of the reflector body 228. Fluid coupling of the grooved surface 238 to the reflective surface 240 allows the coolant 14 (shown in FIG. 3) to flow from the supply plenum 162 (shown in FIG. 3) to the top plenum 162 (shown in FIG. 3) and onto the exterior surface 178 (shown in FIG. 1) of the top wall 132 (shown in FIG. 1) of the reaction chamber 102 (shown in FIG. 1) according to the layout of the plurality of elongated slots 214 and the plurality of shortened slots 216.

In certain examples, the reflective surface 240 may include a reflective layer 254, such as gold-containing layer. In accordance with certain examples, an intermediate layer 256 may couple the reflective layer 254 to the reflector body 228. Examples of suitable intermediate coatings include nickel and nickel-containing materials. As will be appreciated by those of skill in the art in view of the present disclosure, reflective layers such as gold allows the reflective surface 240 to reflect electromagnetic radiation emitted by the heater element 108 toward the reaction chamber 102 (shown in FIG. 1), increasing the amount of heat that the heater element 108 may radiantly communicate into the reaction chamber 102 per unit of power applied to the heater element 108. As will also be appreciated by those of skill in the art in view of the present disclosure, use an intermediate layer allows may accommodate mismatch between in thermal expansion between the material forming the reflector body 228 and the reflective layer 254.

As shown in FIG. 8, the reflective surface 240 may have a plurality of concave surface portions 258. In such examples the plurality of concave surface portions 258 may extend between the first longitudinal edge 230 (shown in FIG. 6) and the second longitudinal edge 232 (shown in FIG. 6) of the reflector body 228. More specifically, the plurality of concave surface portions 258 may define a concave profile 260 between the first lateral edge 234 and the second lateral edge 236 of the reflector body 228, and the plurality of elongated slots 214 and the plurality of shortened slots 216 may be defined in the plurality of concave surface portions 258. In certain examples, the plurality of concave surface portions 258 may extend in parallel with one another between the first longitudinal edge 230 and the second longitudinal edge 232 of the reflector body 228. In accordance with certain examples, the plurality of concave surface portions 258 may be substantially orthogonal to either (or both) the first longitudinal edge 230 and the second longitudinal edge 232. It is also contemplated that plurality of concave surface portions 258 may extend in parallel with either (or both) the first lateral edge 234 and the second lateral edge 236.

With continuing reference to FIG. 6, the plurality of elongated slots 214 extend between the first longitudinal edge 230 and the second longitudinal edge 232 of the reflector body 228. In certain examples, the plurality of elongated slots 214 may extend in parallel with one another. In accordance with certain examples, the plurality of elongated slots 214 may extend in parallel with the plurality of expansion grooves 244. In further examples, the plurality of elongated slots 214 may be orthogonal relative to either (or both) the first longitudinal edge 230 and the second longitudinal edge 232 of the reflector body 228. It is contemplated that the plurality of elongated slots 214 may extend in parallel to either (or both) the first lateral edge 234 and the second lateral edge 236 of the reflector body 228. It is also contemplated that, in accordance with certain examples, each of the plurality of elongated slots 214 may have a longitudinal length that is greater than longitudinal lengths of the plurality of shortened slots 216. In this respect longitudinal lengths of each of the plurality of elongated slots 214 may be shorter than longitudinal lengths of the plurality of expansion grooves 244.

In certain examples, one or more of the plurality of elongated slots 214 may separate the pyrometer port 242 from the first lateral edge 234. One or more of the plurality of elongated slots 214 may separate the pyrometer port 242 from the second lateral edge 236. In accordance with certain examples, the plurality of elongated slots 214 may be smaller than the plurality of shortened slots 216. In further examples, one or more of the plurality of elongated slots 214 may separate the plurality of shortened slots 216 from the pyrometer port 242. It is also contemplated that, in accordance with certain examples, at least one of the plurality of elongated slots 214 may separate the plurality of shortened slots 216 the first lateral edge 234 or the second lateral edge 236. Although a specific number of elongated slots 214 are shown in the illustrated example, it is to be understood and appreciated that examples of the top reflector 202 may have fewer or more elongated slots 214 and remain within the scope of the present disclosure.

The plurality of shortened slots 216 extend between the first longitudinal edge 230 and the second longitudinal edge 232 of the reflector body 228. In this respect the plurality of shortened slots 216 may be orthogonal relative to either (or both) the first longitudinal edge 230 and the second longitudinal edge 232 of the reflector body 228. The plurality of shortened slots 216 may be parallel to either (or both) the first lateral edge 234 and the second lateral edge 236 of the reflector body 228. The plurality of shortened slots 216 may be parallel to the plurality of expansion grooves 268. It is also contemplated that the plurality of shortened slots 216 may be parallel to the plurality of concave surface portions 258 defined by the reflective surface 240 of the reflector body 228.

It is contemplated that the each of the plurality of shortened slots 216 have a longitudinal length that is smaller than the longitudinal length of the plurality of elongated slots 214. In this respect the plurality of shortened slots 216 may have longitudinal lengths that are less than 90% the length of the plurality of elongated slots 214, or less than 70% the length of the plurality of elongated slots 214, or less than 50% the length of the plurality of elongated slots 214, or less than 30% the length of the plurality of elongated slots 214, or even less than 10% the length of the plurality of elongated slots 214. In certain examples, the plurality of shortened slots 216 may include two or more shortened slots having different longitudinal lengths. It is contemplated that the plurality of shortened slots 216 be greater than the plurality of elongated slots 214. It is also contemplated that the plurality of shortened slots be distributed on the reflector body 228 to limit temperature range on the interior surface 176 (shown in FIG. 1) of the top wall 132 (shown in FIG. 1) of the reaction chamber 102. For example, one or more of the plurality of shortened slots 216 may be registered to a localized region that, absent the communication of the coolant 14 through the registered at least one of the plurality of shortened slots 216, exhibits higher temperature than the remainder of the interior surface 176 of the top wall 132 of the reaction chamber 102. As will be appreciated by those of skill in the art in view of the present disclosure, issuing the coolant 14 through the at least one of the plurality of shortened slots 216 against the exterior surface 178 of the top wall 132 may limit the tendency of film to deposit at the location, limiting (or eliminating) risk of devitrification at the location. As will also be appreciated by those of skill in the art in view of the present disclosure, issuing the coolant 14 through the at least one of the plurality of shortened slots 216 against the exterior surface 178 of the top wall 132 may also increase cooling capability of the semiconductor processing system 100 by eliminating the need to reduce the peak temperature on the interior surface 176 of the top wall 132 of the reaction chamber 102 by reducing average temperature on the interior surface 176.

Figure 9:
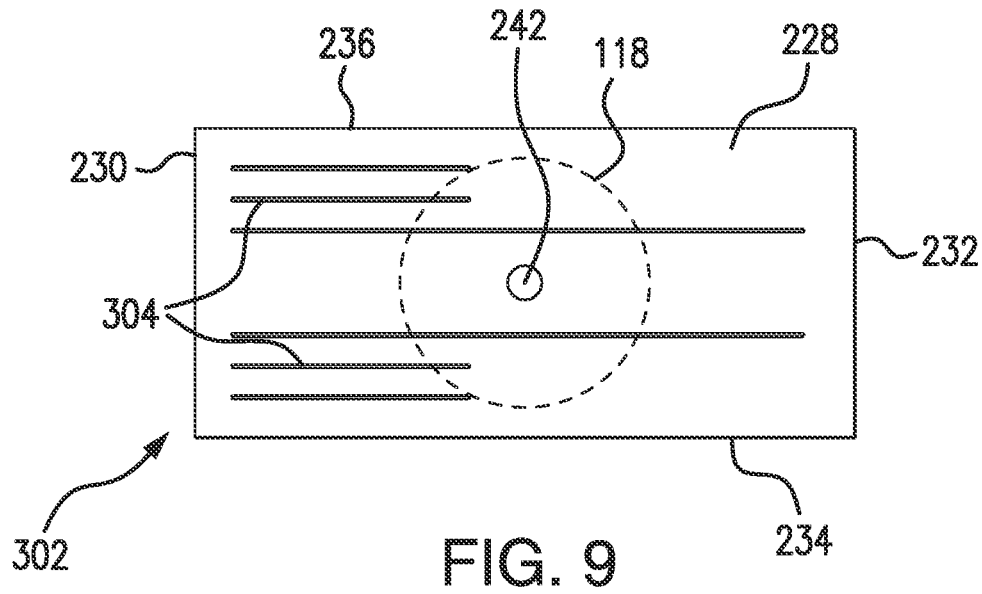
FIGS. 9 and 10 are plan and side views of the top reflector and reaction chamber of FIG. 1 according to an example, showing a top reflector having shortened slots arranged to bias coolant flow toward an injection end of the reaction chamber.
Figure 10:
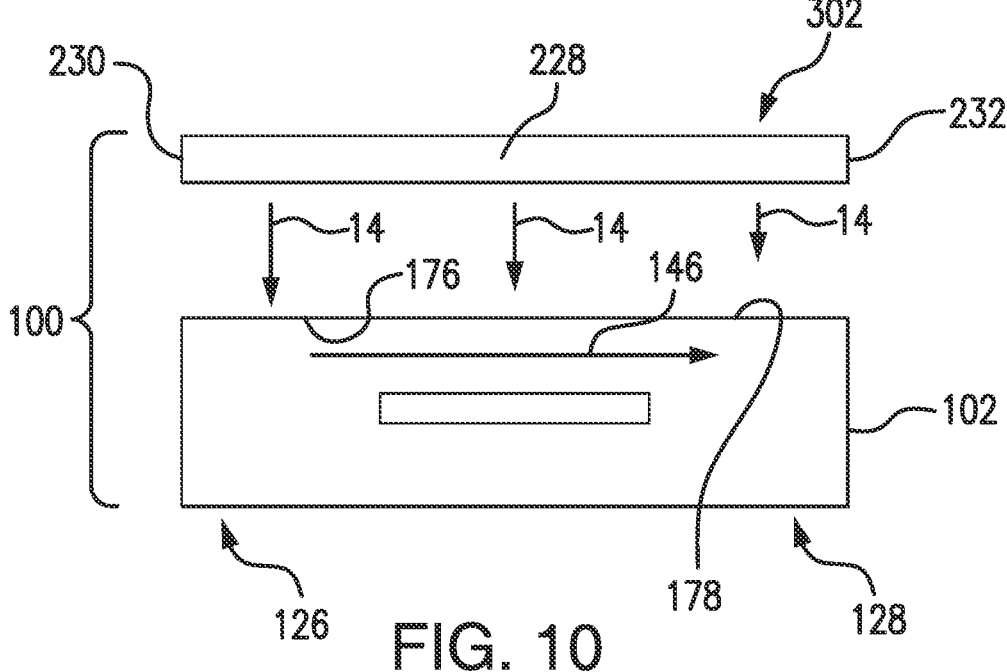

With reference to FIGS. 9 and 10, a top reflector 302 is shown according to another example. The top reflector 302 is similar to the top reflector 202 (shown in FIG. 2) and is additionally configured to bias flow of the coolant 14 toward the first longitudinal edge 230 of the reflector body 228, and thereby toward the injection end 126 of the reaction chamber 102. In this respect the top reflector 302 has a plurality of shortened slots 304. The plurality of shortened slots 304 are located longitudinally between the pyrometer port 242 and the first longitudinal edge 230 of the reflector body 228. More specifically, the plurality of shortened slots 304 are located longitudinally between the pyrometer port 242 and the first longitudinal edge 230 of the reflector body 228, and further laterally separate the pyrometer port 242 from one or more of the first lateral edge 234 and the second lateral edge 236. In certain examples, the plurality of shortened slots 304 may be laterally separated from the pyrometer port 242 by one of the more of the plurality of expansion grooves 244 (shown in FIG. 6). In accordance with certain examples, the plurality of shortened slots 304 may be laterally separated from the pyrometer port 242 by one of the more of the plurality of elongated slots 214. So located, the plurality of shortened slots 304 bias issue of the coolant 14 against the exterior surface 178 of the top wall 132 of the reaction chamber 102 at the injection end 126 of the reaction chamber 102. As will be appreciated by those of skill in the art in view of the present disclosure, this serves to reduce the range of temperatures on the interior surface 176 of the top wall 132 of the reaction chamber 102 during deposition operations where the injection end 126 of the reaction chamber 102 otherwise runs hotter than the remainder of the reaction chamber 102.

Figure 11:
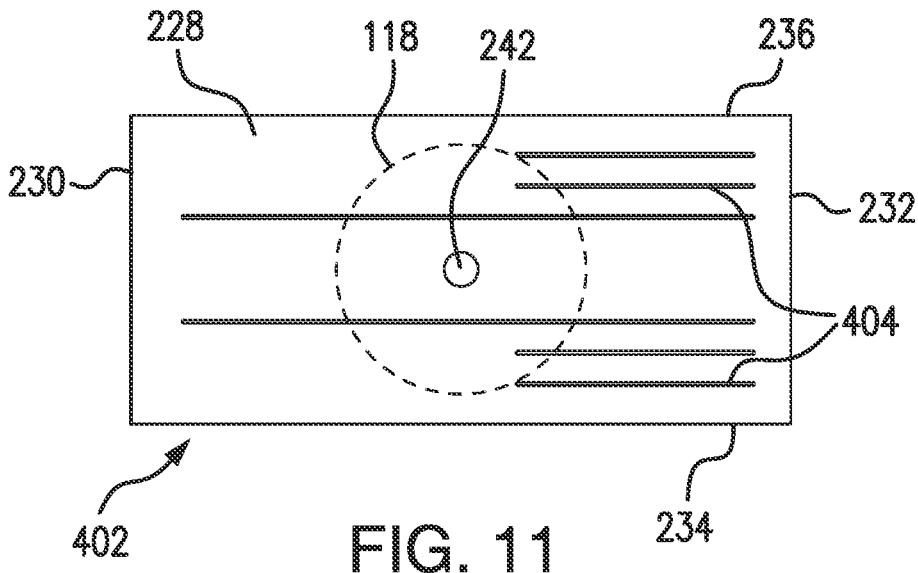
FIGS. 11 and 12 are plan and side views of the top reflector and reaction chamber of FIG. 1 according to an example, showing a top reflector having shortened slots arranged to bias coolant flow toward an exhaust end of the reaction chamber.
Figure 12:
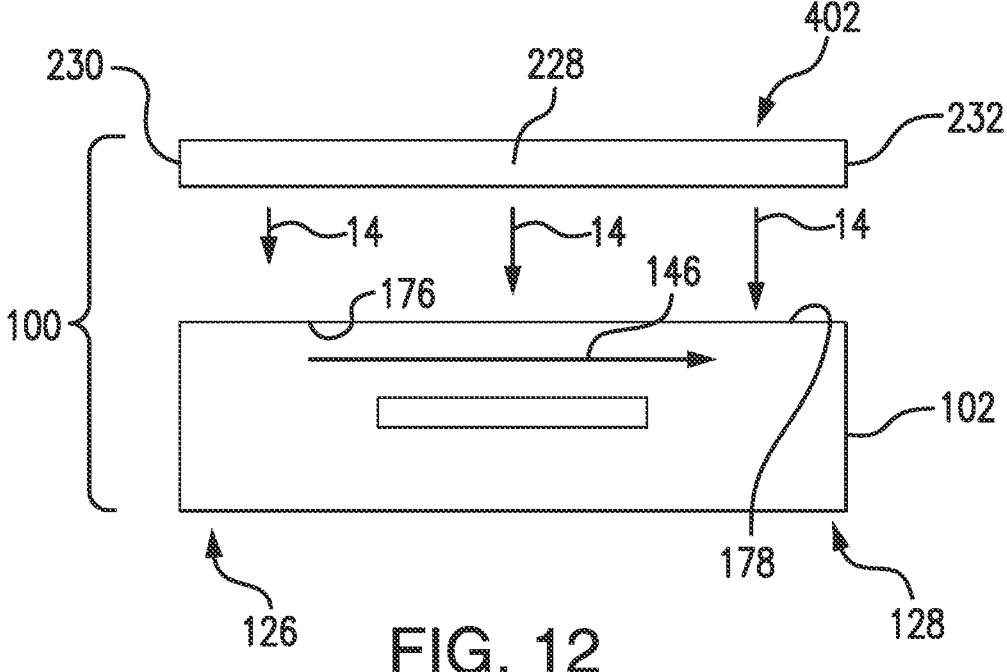

With reference to FIGS. 11 and 12, a top reflector 402 is shown according to a further example. The top reflector 402 is similar to the top reflector 202 (shown in FIG. 2) and is additionally configured to bias flow of the coolant 14 toward the second longitudinal edge 232 of the reflector body 228. In this respect the top reflector 402 has a plurality of shortened slots 404. The plurality of shortened slots 404 are located longitudinally between the pyrometer port 242 and the second longitudinal edge 232 of the reflector body 228. More specifically, the plurality of shortened slots 404 are located between the pyrometer port 242 and the second longitudinal edge 232, and laterally separate distributed between the pyrometer port 242 and one or more of the first lateral edge 234 and the second lateral edge 236. In certain examples, the plurality of shortened slots 404 may be laterally separated from the pyrometer port 242 by one of the more of the plurality of expansion grooves 244. In accordance with certain examples, the plurality of shortened slots 404 may be laterally separated from the pyrometer port 242 by one of the more of the plurality of elongated slots 214. So located, the plurality of shortened slots 404 bias issue of the coolant 14 against the exterior surface 178 of the top wall 132 (shown in FIG. 1) of the reaction chamber 102 at the exhaust end 128 of the reaction chamber 102. As will be appreciated by those of skill in the art in view of the present disclosure, this serves to reduce the range of temperatures on the interior surface 176 of the top wall 132 of the reaction chamber 102 during deposition operations where the exhaust end 128 of the reaction chamber 102 otherwise runs hotter than the remainder of the reaction chamber 102.

Figure 13:
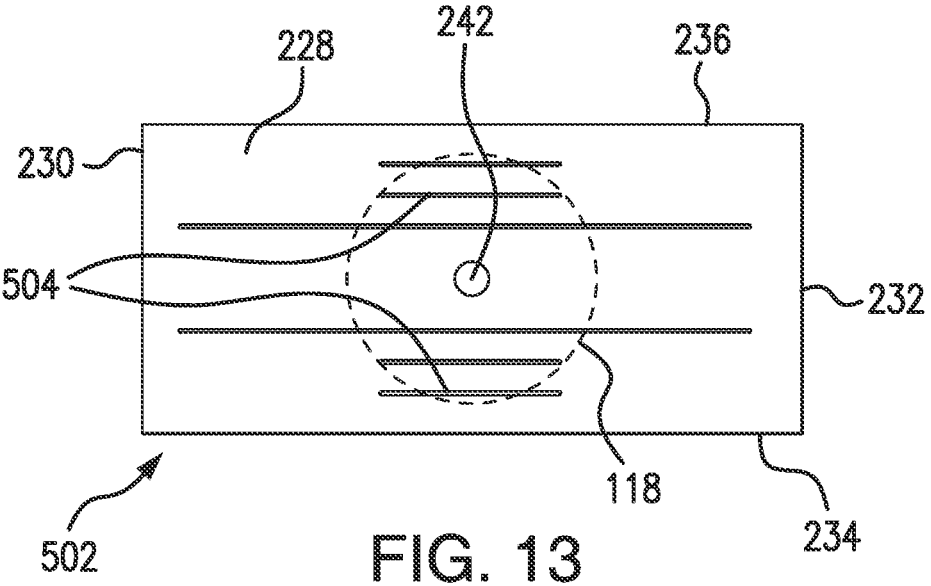
FIGS. 13 and 14 are plan and side views of the top reflector and reaction chamber of FIG. 1 according to an example, showing a top reflector having shortened slots arranged to bias coolant flow toward a substrate supported within the reaction chamber.
Figure 14:
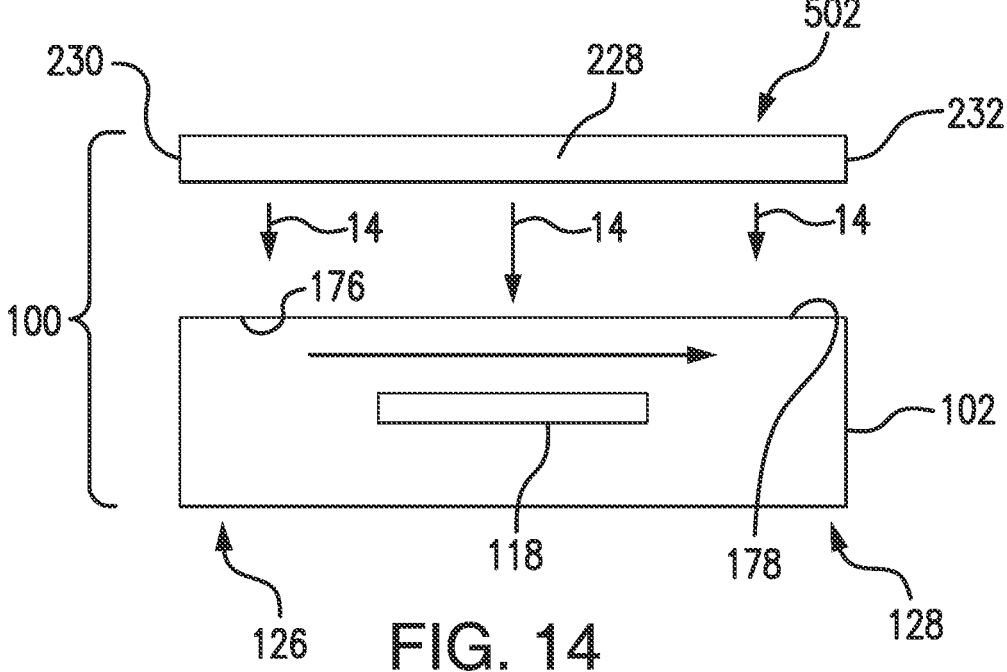

With reference to FIGS. 13 and 14, a top reflector 502 is shown according to another example. The top reflector 502 is similar to the top reflector 202 and is additionally configured to bias flow of the coolant 14 toward am intermediate portion of the top wall 132 (shown in FIG. 1) overlaying the susceptor 118 (shown in FIG. 1). In this respect the top reflector 502 has a plurality of shortened slots 504 that are centrally distributed both between the first longitudinal edge 230 and the second longitudinal edge 232 of the reflector body 228. More specifically, one or more of the plurality of shortened slots 504 longitudinally overlap that the pyrometer port 242 and laterally separates the pyrometer port 242 from the first lateral edge 234 of the reflector body 228, and one or more of the plurality of shortened slots 504 longitudinally overlaps the pyrometer port 242 and laterally separates the pyrometer port 242 from the second lateral edge 236 of the reflector body 228. So located, the plurality of shortened slots 504 bias issue of the coolant 14 against the exterior surface 178 of the top wall 132 (shown in FIG. 1) of the reaction chamber 102 at an intermediate location between the injection end 126 and exhaust end 128 of the reaction chamber 102 that is above the susceptor 118. As will be appreciated by those of skill in the art in view of the present disclosure, this serves to reduce the range of temperatures on the interior surface 176 of the top wall 132 of the reaction chamber 102 during deposition operations where a region of the interior surface 176 of the top wall 132 otherwise runs hotter than other locations on the interior surface 176 of the top wall 132 of the reaction chamber 102.

Figure 15:
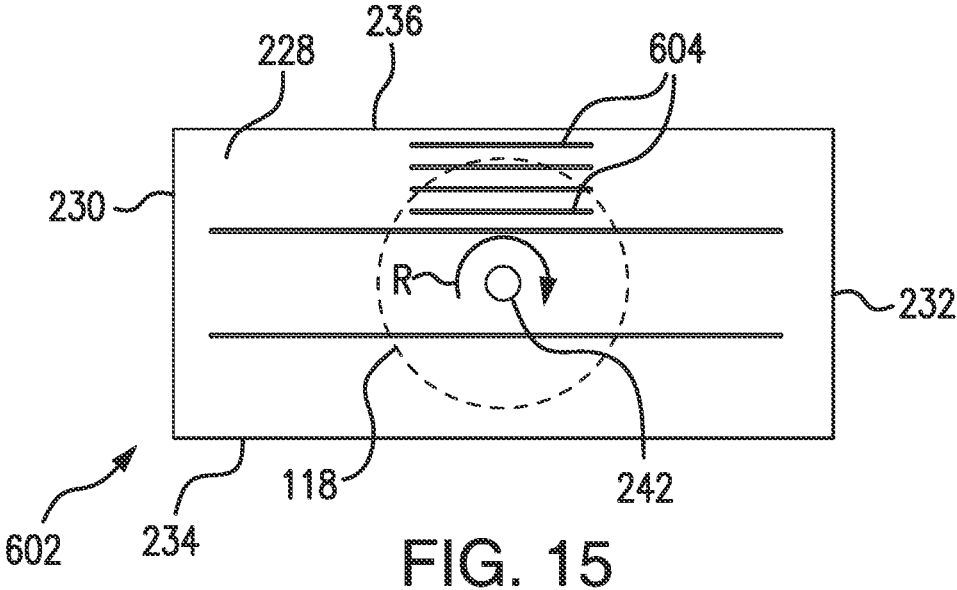
FIGS. 15 and 16 are plan and side views of the top reflector and reaction chamber of FIG. 1 according to an example, showing a top reflector having shortened slots arranged to bias coolant flow toward an advancing portion of a substrate supported within the reaction chamber.
Figure 16:
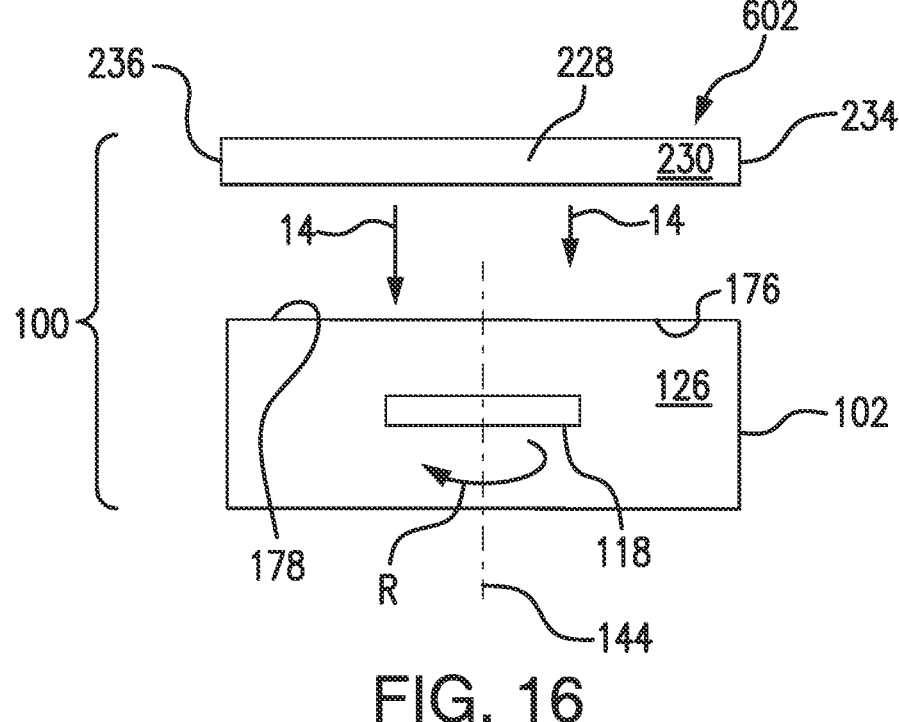

With reference to FIGS. 15 and 16, a top reflector 602 is shown according to a further example. The top reflector 602 is similar to the top reflector 202 and is additionally configured to bias flow of the coolant 14 toward an advancing portion (relative to the general direction of precursor flow) of the susceptor 118 during rotation about the rotation axis 144 (shown in FIG. 1). In this respect the top reflector 602 has a plurality of shortened slots 604. The plurality of shortened slots 604 are located laterally between the pyrometer port 242 and the first lateral edge 234 of the reflector body 228, and longitudinally overlap the pyrometer port 242. In certain examples, the plurality of shortened slots 604 may be distributed laterally between the pyrometer port 242 and both the first lateral edge 234 as well as between the pyrometer port 242 and the second lateral edge 236. In such examples a greater number of the plurality of shortened slots 604 are located between the pyrometer port 242 and the first lateral edge 234 of the reflector body 228 than between the pyrometer port 242 and the second lateral edge 236 of the reflector body 228. So located, the plurality of shortened slots 604 bias issue of the coolant 14 against the exterior surface 178 of the top wall 132 (shown in FIG. 1) of the reaction chamber 102 against a portion of the top wall overlaying the advancing side of the susceptor 118 and/or substrate 10 (shown in FIG. 1). As will be appreciated by those of skill in the art in view of the present disclosure, this may reduce the range of temperatures on the interior surface 176 of the top wall 132 of the reaction chamber 102 during deposition operations where the flow pattern causes the portion of the interior surface 176 of the top wall 132 of the reaction chamber 102 to differ in temperature from the portion of the interior surface 176 of the top wall 132 overlaying the retreating portion of the susceptor 118.

Figure 17:
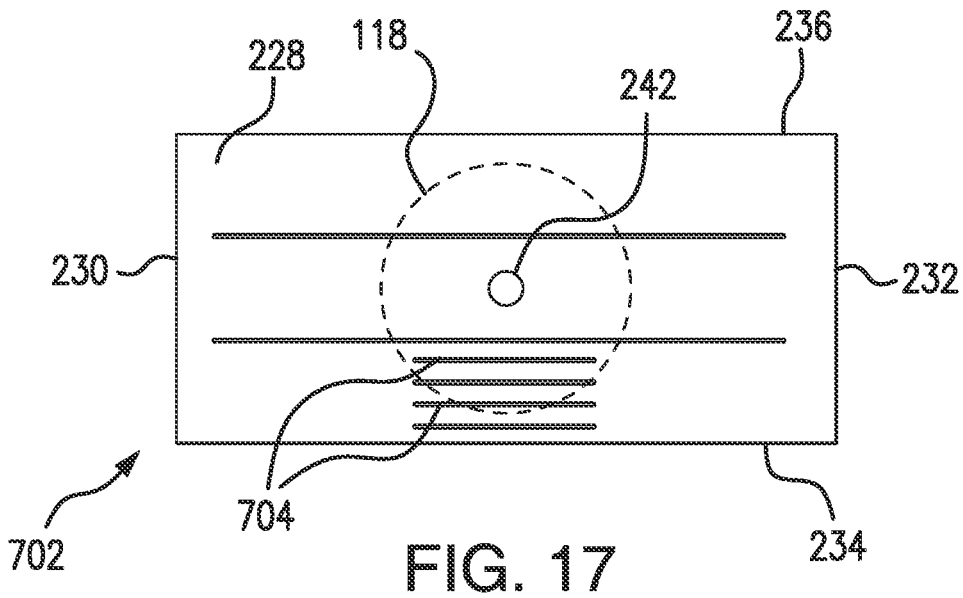
FIGS. 17 and 18 are plan and side views of the top reflector and reaction chamber of FIG. 1 according to an example, showing a top reflector having shortened slots arranged to bias coolant flow toward a retreating portion of a substrate supported within the reaction chamber.
Figure 18:
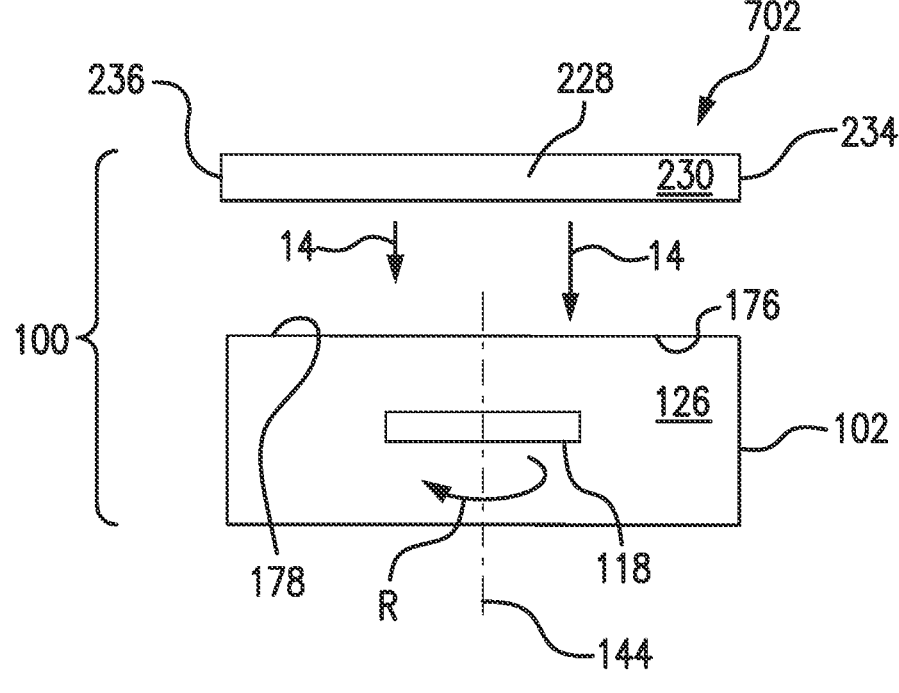

With reference to FIGS. 17 and 18, a top reflector 702 is shown according to another example. The top reflector 702 is similar to the top reflector 202 and is additionally configured to bias flow of the coolant 14 toward a retreating portion (relative to the general direction of precursor flow) of the susceptor 118 during rotation about the rotation axis 144. In this respect the top reflector 702 has a plurality of shortened slots 704. The plurality of shortened slots 704 are located laterally between the pyrometer port 242 and the second lateral edge 236 of the reflector body 228, and longitudinally overlap the pyrometer port 242. In certain examples, the plurality of shortened slots 704 may be distributed laterally between the pyrometer port 242 and both the first lateral edge 234 as well as between pyrometer port 242 and the second lateral edge 236. In such examples a greater number of the plurality of shortened slots 704 are located between the pyrometer port 242 and the second lateral edge 236 of the reflector body 228 than between the pyrometer port 242 and the second lateral edge 236 of the reflector body 228. So located, the plurality of shortened slots 704 bias issue of the coolant 14 against the exterior surface 178 of the top wall 132 (shown in FIG. 1) of the reaction chamber 102) against a portion of the top wall overlaying the retreating portion of the susceptor 118 and/or the substrate 10 (shown in FIG. 1). As will be appreciated by those of skill in the art in view of the present disclosure, this may reduce the range of temperatures on the interior surface 176 of the top wall 132 of the reaction chamber 102 during deposition operations where the flow pattern causes a portion of the interior surface 176 of the top wall 132 of the reaction chamber 102 than the portion of interior surface 176 of the top wall 132 overlaying the advancing portion of the susceptor 118.

Figure 19:
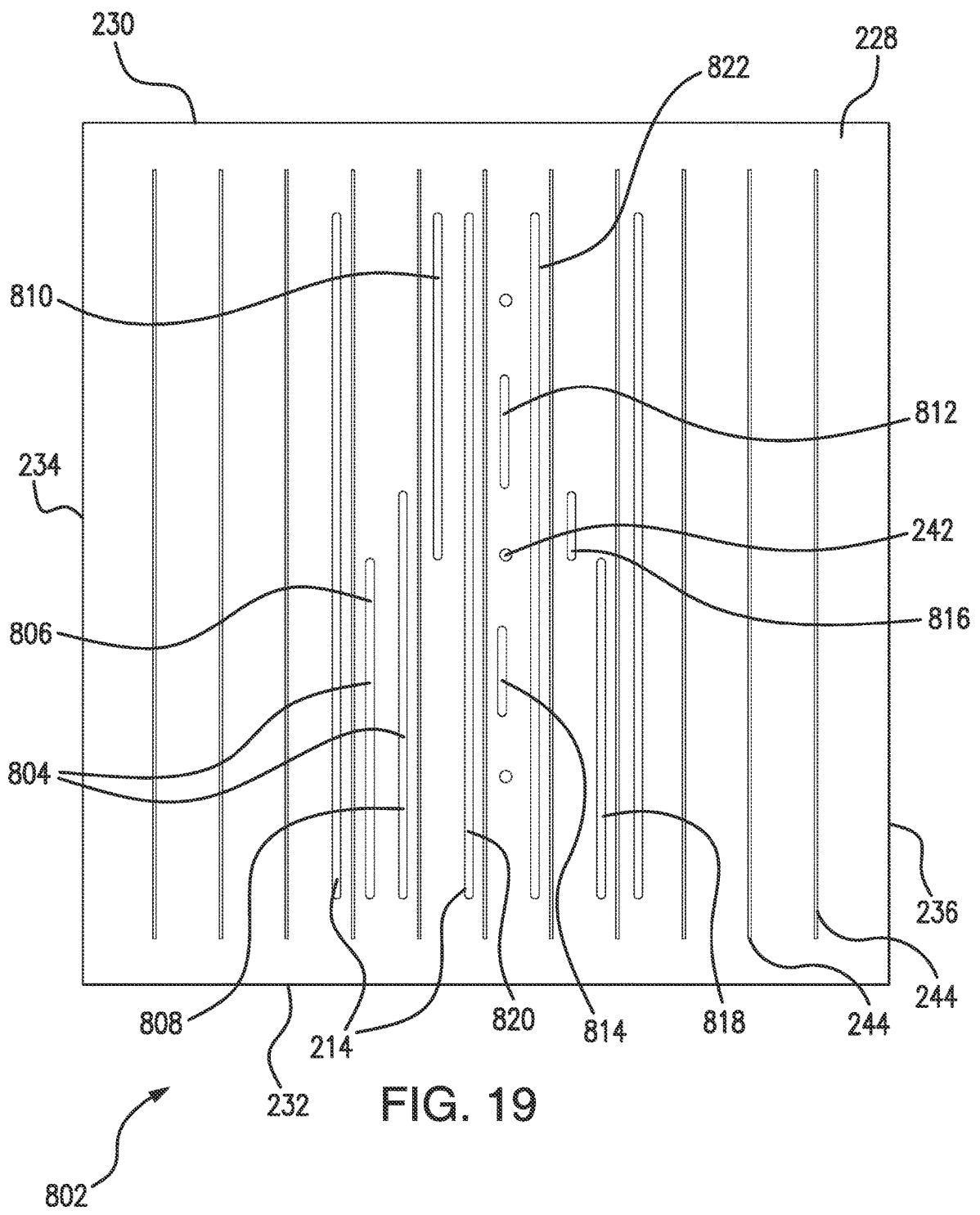
FIG. 19 is a plan view of the top reflector of FIG. 1 according to an example, showing a top reflector having shortened slots thermally matched to a film deposition process.

With reference to FIG. 19, a top reflector 802 is shown. The top reflector 802 is similar to the top reflector 202 (shown in FIG. 2) and is additionally has a plurality of shortened slots 804 configured to match distribution of the coolant 14 across the exterior surface 178 (shown in FIG. 1)

of the reaction chamber 102 (shown in FIG. 1) according to heating of the interior surface 176 (shown in FIG. 1) of the reaction chamber 102. In this respect the plurality of shortened slots 804 is greater than each of the plurality of elongated slots 214, and the plurality of shortened slots 804 have longitudinal lengths that are between 10% and 60% the longitudinal length of each of the plurality of elongated slots 214. More specifically, the plurality of shortened slots 804 define three or more (e.g., seven) shortened slot lengths. As shown in FIG. 19 the plurality of shortened slots 216 include a first shortened slot 806 is about 50% the longitudinal length of each of the plurality of elongated slots 214, a second shortened slot 808 and a third shortened slot 810 are about 60% the length of the plurality of each of elongated slots 214, a fourth shortened slot 812 is about 20% the length of each of the plurality of elongated slots 214, a fifth shortened slot 814 is about 30% the length of each of the plurality of elongated slots 214, a sixth shortened slot 816 is about 10% the length of each of the plurality of elongated slots 214, and a seventh shortened slot 818 is about 50% the longitudinal length of each of the plurality of elongated slots 214. Although a particular number of shortened slots and shortened slot lengths are shown, it is to be understood and appreciated that examples of the top reflector 802 may have different numbers of shortened slots and/or shortened slot lengths and remain within the scope of the present disclosure.

It is contemplated that one or more of the plurality of elongated slots 214 may separate a plurality of the shortened slots from the pyrometer port 242. In this respect a first elongated slot 820 separates the first shortened slot 806 and the second shortened slot 808 from the pyrometer port 242, and a second elongated slot 822 separates the sixth shortened slot 816 and the seventh shortened slot 818 from the pyrometer port 242. It is also contemplated that one or more of the plurality of elongated slots 214 may separate a plurality of the shortened slots from a lateral edge of the reflector body 228. The first elongated slot 820 separates the sixth shortened slot 816 and the seventh shortened slot 818 from the first lateral edge 234, and the second elongated slot 822 separates the first shortened slot 806 and the second shortened slot 808 from the second lateral edge 236.

In certain examples, a first of the plurality of shortened slots 804 may longitudinally overlap a second of the plurality of shortened slots 804. In this respect the second shortened slot 808 longitudinally overlaps the first shortened slot 806, and the fourth shortened slot 812 longitudinally overlaps the third shortened slot 810. In accordance with certain examples, a first of the plurality of shortened slots 804 may be longitudinally offset from a second of the plurality of shortened slots 804. In this respect the third shortened slot 810 is longitudinally offset from the first shortened slot 806, the fourth shortened slot 812 is longitudinally offset from the fifth shortened slot 814, and the sixth shortened slot 816 is longitudinally offset from the seventh shortened slot 818. In further examples, one or more of the plurality of shortened slots 804 may longitudinally overlap the pyrometer port 242. In this respect the second shortened slot 808, the third shortened slot 810, and sixth shortened slot 816 longitudinally overlaps the pyrometer port 242 in the illustrated example.

In accordance with certain examples, a first of the plurality of shortened slots 804 may be laterally offset from a second of the plurality of shortened slots 804. In this respect the second shortened slot 808 is laterally offset from the first shortened slot 806, the third shortened shot is laterally offset from the second shortened slot 808, and both the fourth shortened slot 812 and the fifth shortened slot 814 are laterally offset from the third shortened slot 810. In further respect, the sixth shortened slot 816 is laterally offset from the fourth shortened slot 812 and the fifth shortened slot 814, and the seventh shortened slot 818 is laterally offset from the sixth shortened slot 816. In further examples, a first of the plurality of shortened slots 804 may be spaced apart from a second of the plurality of shortened slots 804 by one or more of the plurality of expansion grooves 244, and one or more of the plurality of shortened slots 804 may be separated from the pyrometer port 242 by one or more of the plurality of expansion grooves 244. In this respect a first expansion groove 826 separates the first shortened slot 806 from the third shortened slot 810, and further separates the first shortened slot 806 from the pyrometer port 242.

With reference to FIGS. 20 and 21, a film deposition method 900 is shown according to an illustrative and non-limiting example. As shown in FIG. 19, the method 900 includes depositing a film onto a substrate while supported within a reaction chamber, e.g., the film 12 (shown in FIG. 1) onto the substrate 10 (shown in FIG. 1) while supported within the reaction chamber 102 (shown in FIG. 1), as shown with bracket 910. The method 900 also includes cooling an exterior of the reaction chamber during the deposition of the film onto the substrate, e.g., cooling the exterior surface 178 (shown in FIG. 1) of the reaction chamber 102, as shown with bracket 920.

As shown with box 912, depositing the film onto the substrate includes flowing at least one precursor, e.g., the first precursor 146 (shown in FIG. 1), across the substrate while supported within the reaction chamber. In certain examples, the at least one precursor may be a silicon-containing precursor. In accordance with certain examples, the at least one precursor may include germanium. In further examples, the at least one precursor may include a dopant, such as a p-type dopant or an n-type dopant. It is also contemplated that the precursor may be an exothermic precursor, e.g., trichlorosilane, temperatures within the reaction chamber running between about 900 degrees Celsius and 1200 about degrees Celsius in certain examples.

As shown with box 914, depositing the film onto the substrate includes depositing the film onto the substrate as the precursor flows across the substrate. In certain examples, the film may be an epitaxial film. In accordance with certain examples, the film may be a film for a power electronics device, such as an insulated gate bipolar transistor device. In further examples, the film may be a relatively thick film. In this respect the film may have a thickness that is greater than 0.1 microns, or greater than 0.25 microns, or greater than 0.5 microns, or greater than 0.75 microns, or even greater than 1.0 microns. The film may have a thickness that is between about 0.1 microns and about 1.0 micron.

As shown with box 916, depositing the film includes heating the reaction chamber during the deposition of the film onto the substrate. For example, heating the reaction chamber may include heating the using heat from one or more exothermic precursors flowing across the substrate. Heating the reaction chamber may include heating the substrate by radiantly communicating heat into the reaction chamber from an external heater element, e.g. the heater element 108 (shown in FIG. 1) and/or the heater element array 174 (shown in FIG. 8). In such examples the heater element and/or heater element array may heat walls of the reaction chamber according to transmissivity of the reaction chamber wall. It is also contemplated that the reaction chamber may be heated (at least in part) by one or more reflector arranged outside of the reaction chamber and radiantly coupling the heater element to the reaction chamber, e.g., the top reflector 202 (shown in FIG. 2) and one or more of the side reflectors 204-210 (shown in FIG. 2).

As shown in FIG. 21, it is contemplated that depositing the film onto the substrate may include rotating the substrate relative to the general direction of precursor within the reaction chamber, as shown with box 918. In certain examples the substrate may be supported within the reaction chamber on a susceptor, e.g., the susceptor 118 (shown in FIG. 1). The susceptor may be rotated about a rotation axis, e.g., about the rotation axis 144 (shown in FIG. 1). The rotation axis be substantially orthogonal relative to the general direction of flow through the reaction chamber between an injector and an exhaust manifold on opposite ends of the reaction chamber, e.g., the injection flange 104 (shown in FIG. 1) and the exhaust manifold 106 (shown in FIG. 1). The rotation of the substrate and susceptor about the rotation axis may cause uneven heating of an interior surface of the reaction chamber due to the relative acceleration and deceleration of fluid traversing laterally opposite advancing and retreating portions and the substrate and susceptor.

With continuing reference to FIG. 20, cooling the reaction chamber may include receiving a coolant, e.g., the coolant 14 (shown in FIG. 3), at the top reflector, as shown with box 922. It is contemplated that the coolant flow through the plurality of elongated slots and the plurality of shortened slots extending through the top reflector, as shown with box 924, and that the plurality of elongated slots and the plurality of shortened slots distribute the coolant onto (e.g., across) an exterior surface of the reaction chamber, e.g., the exterior surface 178 (show in FIG. 1), of the reaction chamber, as shown with box 926. In this respect the cooling the reaction chamber may include biasing distribution of the coolant across the exterior of the reaction chamber using the plurality of shortened slots, as shown with box 930.

As shown in FIG. 21, biasing distribution of the coolant may include biasing distribution of the coolant toward the injection end of the reaction chamber, as shown with box 932. For example, more mass flow of coolant may be communicated by the plurality of shortened slots to the exterior surface of the top wall of the reaction chamber at the injection end of the reaction chamber than is communicated to the exterior surface of the top wall of the reaction chamber at the exhaust end of the reaction chamber. In certain examples, the mass flow of coolant may be uniformly distributed laterally across the exterior surface of the top wall at the injection end of the reaction chamber. In accordance with certain examples, the mass flow of coolant may be nonuniformly distributed across the exterior surface of the top wall at the injection end of the reaction chamber.

As shown with box 934, biasing distribution of the coolant may include biasing distribution of the coolant toward the exhaust end of the reaction chamber. For example, more mass flow of coolant may be communicated by the plurality of shortened slots to the exterior surface of the top wall of the reaction chamber at the exhaust end of the reaction chamber than is communicated to the exterior surface of the top wall of the reaction chamber at the injection end of the reaction chamber. In certain examples, the mass flow of coolant may be uniformly distributed laterally across the exterior surface of the top wall at the exhaust end of the reaction chamber. In accordance with certain examples, the mass flow of coolant may be nonuniformly distributed across the exterior surface of the top wall at the exhaust end of the reaction chamber.

As shown with box 936, biasing distribution of the coolant may include biasing distribution of the coolant toward the advancing portion of the substrate and susceptor relative to the direction of flow through the reaction chamber. In this respect more mass flow of coolant may be communicated by the plurality of shortened slots to the exterior surface of the top wall of the reaction chamber onto a side of the reaction chamber overlaying the advancing portion of the substrate and susceptor within the reaction chamber communicated to the exterior surface of the top wall of the reaction chamber onto a side of the reaction chamber overlaying the retreating portion of the substrate and susceptor within the reaction chamber. In certain examples, the mass flow of coolant may be uniformly distributed longitudinally across the exterior surface of the top wall onto the side of the reaction chamber overlaying advancing portion of the substrate and susceptor. In accordance with certain examples, the mass flow of coolant may be nonuniformly distributed across the exterior surface of the top wall onto the side of the reaction chamber overlaying the advancing portion of the substrate and the susceptor.

As shown with box 938, biasing distribution of the coolant may include biasing distribution of the coolant toward the retreating portion of the substrate and susceptor relative to the direction of flow through the reaction chamber. In this respect more mass flow of coolant may be communicated by the plurality of shortened slots to the exterior surface of the top wall of the reaction chamber onto a side of the reaction chamber overlaying the retreating portion of the substrate and susceptor within the reaction chamber communicated to the exterior surface of the top wall of the reaction chamber onto a side of the reaction chamber overlaying the advancing portion of the substrate and susceptor within the reaction chamber. In certain examples, the mass flow of coolant may be uniformly distributed longitudinally across the exterior surface of the top wall onto the side of the reaction chamber overlaying retreating portion of the substrate and susceptor. In accordance with certain examples, the mass flow of coolant may be nonuniformly distributed across the exterior surface of the top wall onto the side of the reaction chamber overlaying the retreating portion of the substrate and the susceptor.

The examples presented above do not limit the scope of the present disclosure as these examples merely illustrate the present invention, which is defined by the appended claims and legal equivalents. Any equivalent embodiments are intended to be within the scope of the present disclosure. Indeed, various modifications of the present disclosure, in addition to those shown and described herein, such as alternative useful combinations of the elements described, may become apparent to those skilled in the art from the present description. Such modifications and embodiments are also intended to fall within the scope of the appended claims.

The terminology used herein is for the purpose of describing particular examples only and is not intended to limit the claims. As used herein, the singular forms "a," "an," and "the" are intended to include plural forms as well, unless the context clearly indicates otherwise. It will be further understood that the terms "includes," "including," "has," "having," "comprises," and/or "comprising," when used in this specification, specify the presence of state features, integers, steps, operations, elements, and/or components, but do not preclude the presence or addition of one or more other features, integers, steps, operations, elements, components, and/or groups thereof.

What is claimed is:

1. A top reflector, comprising:
   a reflector body configured to overlap a reaction chamber of a semiconductor processing system, the reflector body having:
      a grooved surface extending between a first longitudinal edge of the reflector body and a second longitudinal edge of the reflector body;
      a reflective surface spaced apart from the grooved surface by a thickness of the reflector body, the reflective surface having greater reflectivity than the grooved surface;
      wherein the grooved surface and the reflective surface define a pyrometer port extending through the thickness of the reflector body;
      wherein the grooved surface and the reflective surface define a plurality of elongated slots extending through the thickness of the reflector body; and
      wherein the grooved surface and the reflective surface define a plurality of shortened slots extending through the reflector body, the plurality of shortened slots being greater than the plurality of elongated slots, wherein the plurality of shortened slots define three or more unequal shortened slot lengths.

2. The top reflector of claim 1, wherein each of the plurality of shortened slots has a shortened slot length, wherein each of the plurality of elongated slots has an elongated slot length, and wherein the shortened slot length is between 10% and 60% of the elongated slot length.

3. The top reflector of claim 1, wherein one or more of the plurality of elongated slots separates the plurality of shortened slots from the pyrometer port.

4. The top reflector of claim 1, wherein one or more of the plurality of elongated slots separates the plurality of shortened slots from a lateral edge of the reflector body.

5. The top reflector of claim 1, wherein a first of the plurality of shortened slots longitudinally overlaps a second of the plurality of the shortened slots.

6. The top reflector of claim 1, wherein a first of the plurality of shortened slots is longitudinally offset from a second of the plurality of shortened slots.

7. The top reflector of claim 1, wherein at least one of the plurality of shortened slots longitudinally overlaps the pyrometer port.

8. The top reflector of claim 1, wherein a first of the plurality of shortened slots is laterally offset from a second of the plurality of shortened slots.

9. The top reflector of claim 1, wherein the grooved surface defines a plurality of expansion grooves extending in parallel with one another, wherein the plurality of elongated slots are parallel to the plurality of expansion grooves, and wherein the plurality of shortened slots are parallel to the plurality of expansion grooves.

10. The top reflector of claim 9, wherein a first of the plurality of shortened slots is spaced apart from a second of the plurality of shortened slots by one or more of the plurality of expansion grooves.

11. The top reflector of claim 9, wherein one or more of the plurality of shortened slots is separated from the pyrometer port by the plurality of expansion grooves.

12. The top reflector of claim 1, wherein the reflective surface has a reflective coating, wherein the reflective coating comprises gold, wherein the top reflector further comprises an intermediate layer coupling the reflective coating to the reflector body, wherein the intermediate layer comprises nickel.

13. The top reflector of claim 1, wherein the reflective surface comprises a plurality of concave surface portions extending in parallel with one another, wherein the plurality of concave surface portions define a concave profile between a first lateral edge and a second lateral edge of the reflector body, wherein a first of the plurality of shortened slots extends through a first of the plurality of concave surface portions, and wherein a second of the plurality of shortened slots extends through a second of the plurality of concave surface portions.

14. The top reflector of claim 13, wherein a first of the plurality of shortened slots is spaced apart from a second of the plurality of shortened slots by one or more of the plurality of concave surface portions.

15. The top reflector of claim 1, wherein the pyrometer port is a first pyrometer port, and wherein the grooved surface and the reflector surface define a second pyrometer port extending through the thickness of the reflector body between the first pyrometer port and the first longitudinal edge of the reflector body.

16. The top reflector of claim 15, wherein one or more of the plurality of shortened slots longitudinally overlaps the first pyrometer port and the second pyrometer port.

17. The top reflector of claim 16, wherein two or more of the plurality of shortened slots are longitudinally offset from the second pyrometer port.

18. A semiconductor processing system, comprising:
a reaction chamber with a susceptor supported within an interior of the reaction chamber;
a heater element supported above the reaction chamber; and
a reflector as recited in claim 1 supported above the heater element, wherein the heater element is radiantly coupled to the susceptor by the reflective surface of reflector body and walls of the reaction chamber.

19. A film deposition method, comprising:
receiving a coolant at a top reflector supported above a reaction chamber;
flowing the coolant through a plurality of elongated slots and a plurality of shortened slots extending through the top reflector;
distributing the coolant across an exterior of the reaction chamber using the plurality of elongated slots and the plurality of shortened slots; and
biasing distribution of the coolant across the exterior of the reaction chamber using the plurality of shortened slots,
wherein the plurality of shortened slots biases distribution of the coolant toward an injection end of the reaction chamber or an exhaust end of the reaction chamber.

\* \* \* \* \*